United States Patent [19]
Toda

[11] Patent Number: 5,895,482
[45] Date of Patent: Apr. 13, 1999

[54] DATA TRANSFER SYSTEM FOR TRANSFERRING DATA IN SYNCHRONIZATION WITH SYSTEM CLOCK AND SYNCHRONOUS SEMICONDUCTOR MEMORY

[75] Inventor: Haruki Toda, Yokohama, Japan

[73] Assignee: Kabushiki Kaisha Toshiba, Tokyo, Japan

[21] Appl. No.: 08/730,613

[22] Filed: Sep. 12, 1996

[30] Foreign Application Priority Data

Sep. 12, 1995 [JP] Japan .................................. 7-234520
Sep. 9, 1996 [JP] Japan .................................. 8-238159

[51] Int. Cl.$^6$ .............................. G06F 12/00; G06F 13/00
[52] U.S. Cl. .......................... 711/104; 711/100; 711/167; 711/169; 711/154; 365/194; 365/233; 365/189.05; 365/220
[58] Field of Search ........................... 711/100, 104, 711/154, 167, 169, 173; 365/233, 194, 240, 189.12, 189.05, 219, 220

[56] References Cited

U.S. PATENT DOCUMENTS

| | | |
|---|---|---|
| 4,649,512 | 3/1987 | Nukiyama . |
| 5,260,905 | 11/1993 | Mori .................... 365/230.05 |
| 5,313,431 | 5/1994 | Urama et al. ............ 365/230.05 |
| 5,325,329 | 6/1994 | Inoue et al. ............. 365/189.05 |
| 5,343,427 | 8/1994 | Terugama ................ 365/189.04 |
| 5,379,263 | 1/1995 | Ogawa et al. ........... 365/230.04 |
| 5,392,254 | 2/1995 | Toda ............................ 365/240 |
| 5,394,528 | 2/1995 | Kobayashi et al. ............ 395/325 |
| 5,402,389 | 3/1995 | Flannagan et al. . |
| 5,508,970 | 4/1996 | Toda ............................ 365/240 |
| 5,594,923 | 1/1997 | Inoue et al. ................... 395/842 |
| 5,596,541 | 1/1997 | Toda ........................ 365/230.03 |
| 5,713,005 | 1/1998 | Proebsting ..................... 711/169 |

FOREIGN PATENT DOCUMENTS

| | | |
|---|---|---|
| 0326172 | 2/1989 | European Pat. Off. . |
| 704849 | 4/1996 | European Pat. Off. . |

Primary Examiner—Tod R. Swann
Assistant Examiner—Tuan V. Thai
Attorney, Agent, or Firm—Loeb & Loeb LLP

[57] ABSTRACT

The synchronous memory device includes a data transfer control circuit including a pipeline control circuit which, when serial access is started in a cycle corresponding to two cycles of a clock BCK, does not separate all of the first to third pipeline stages from each other and brings the first pipeline stage and the second pipeline stage into a through state. When serial access is started in a cycle departing from the two cycles of the clock BCK, the pipeline control circuit separates all of the first to third pipeline stages from each other.

21 Claims, 23 Drawing Sheets

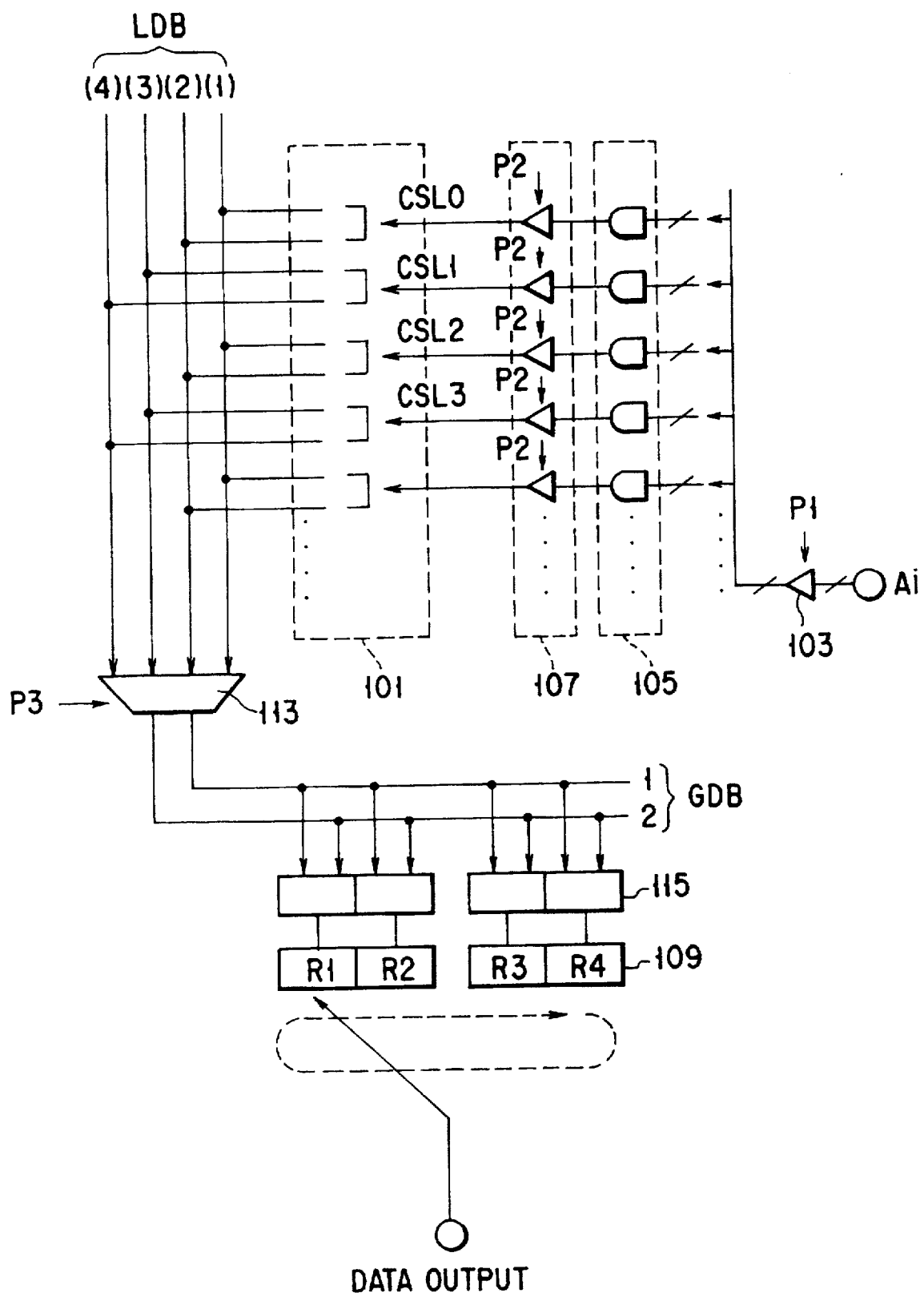
F I G. 3

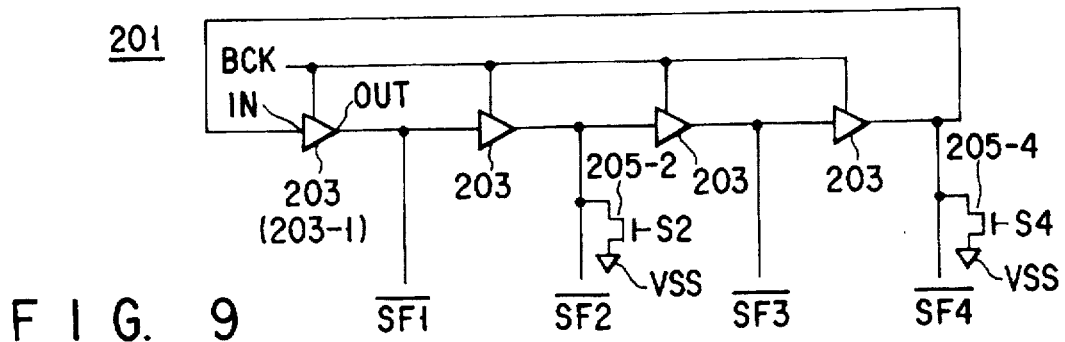
F I G. 9
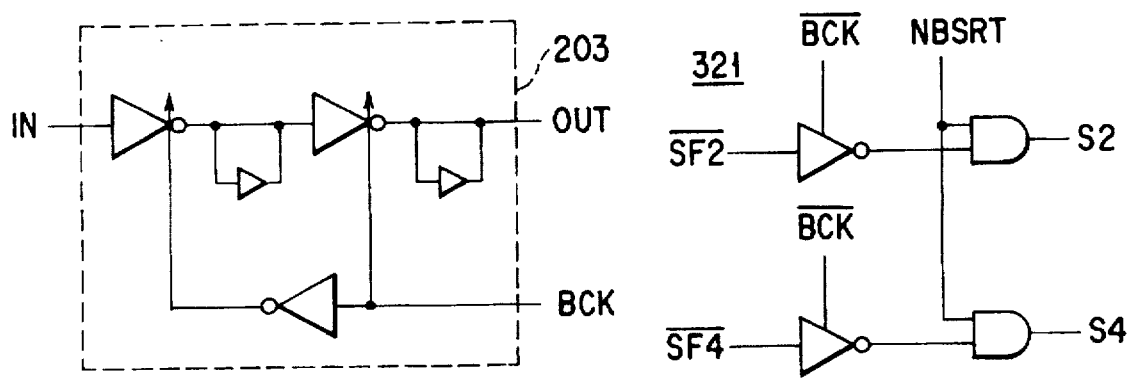
F I G. 10    F I G. 11
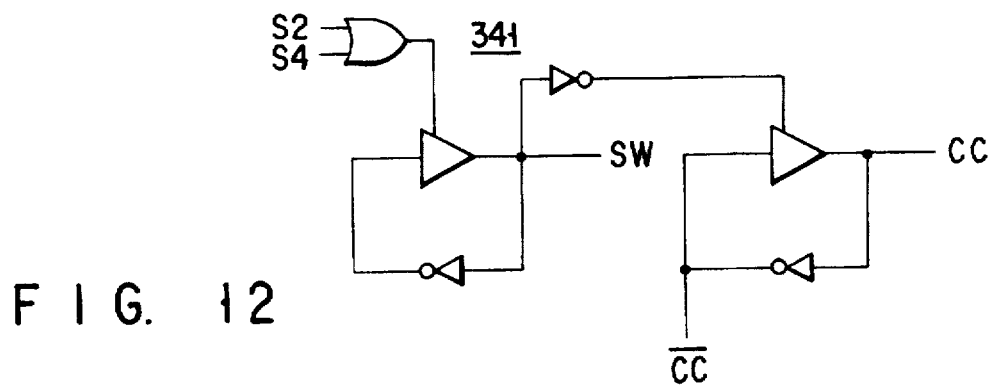
F I G. 12
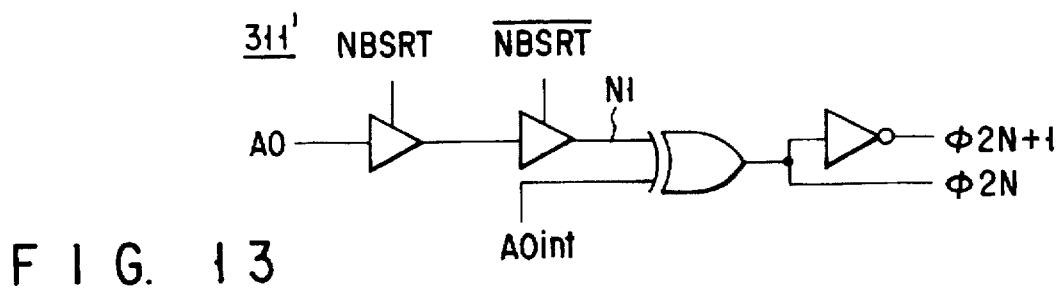
F I G. 13

| LDB | (1) | (2) | (3) | (4) |
|-----|-----|-----|-----|-----|
| A0  | 0   | 1   | 0   | 1   |
| A1  | 0   | 0   | 1   | 1   |
|     | AB1 |     | AB2 |     |

F I G. 17

| CSL0 | (1)(2) | CSL1 | (3)(4) | CSL2 | (1)(2) | CSL3 | (3)(4) |
|------|--------|------|--------|------|--------|------|--------|
| CSLm+0 | (3)(4) | CSLm+1 | (1)(2) | CSLm+2 | (3)(4) | CSLm+3 | (1)(2) |
|      | LDB |      | LDB |      | LDB |      | LDB |

F I G. 18

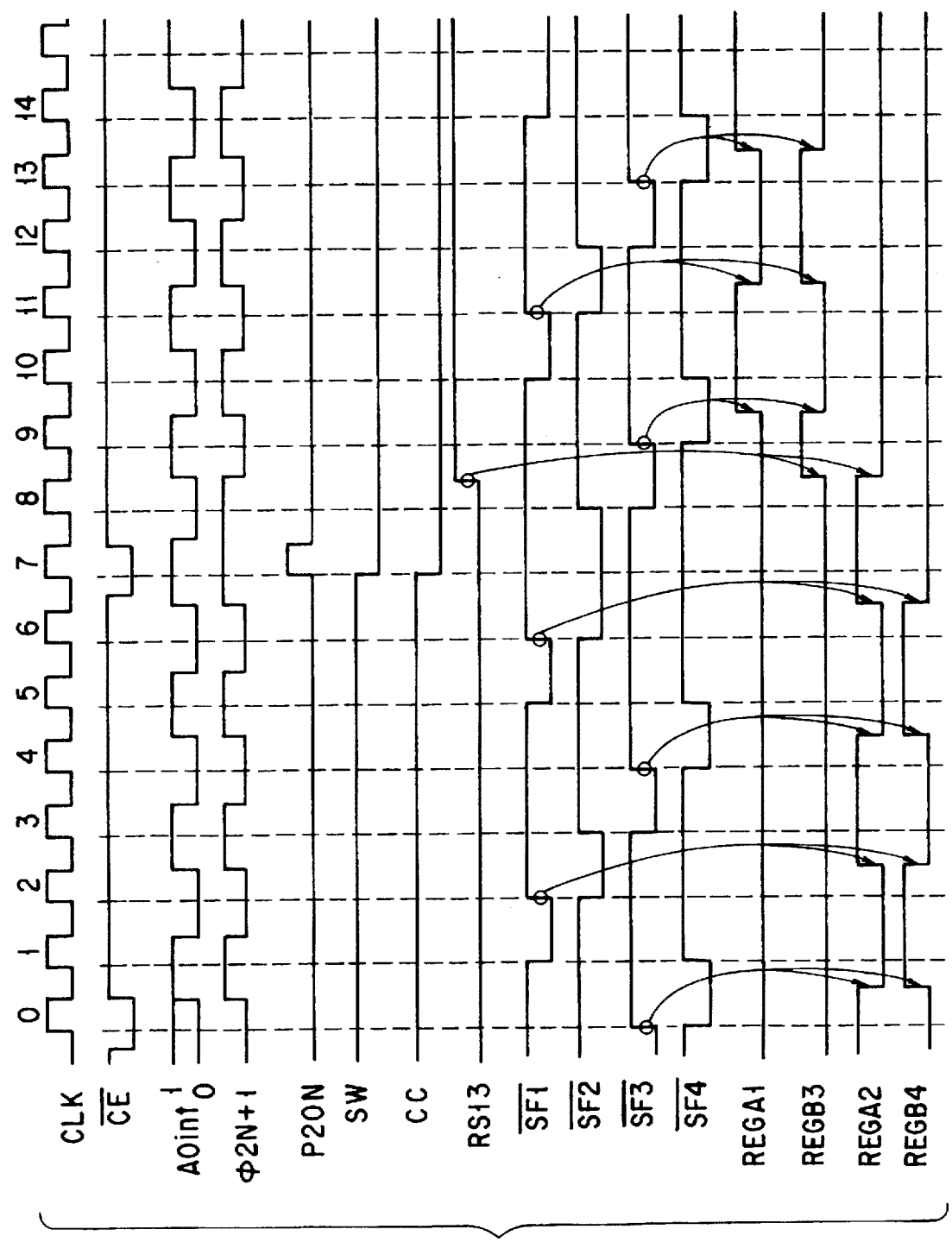
F I G. 26

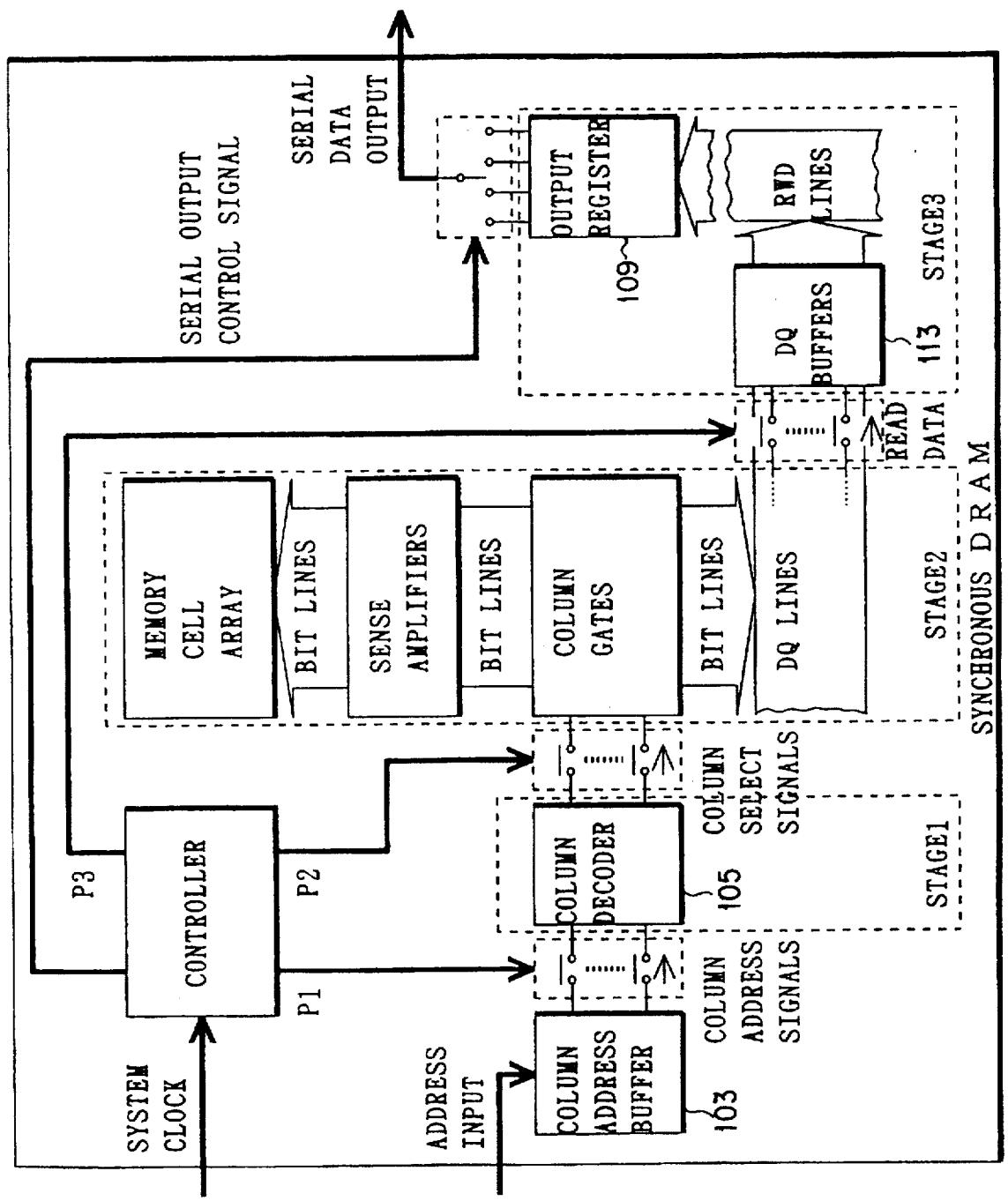
F I G. 27

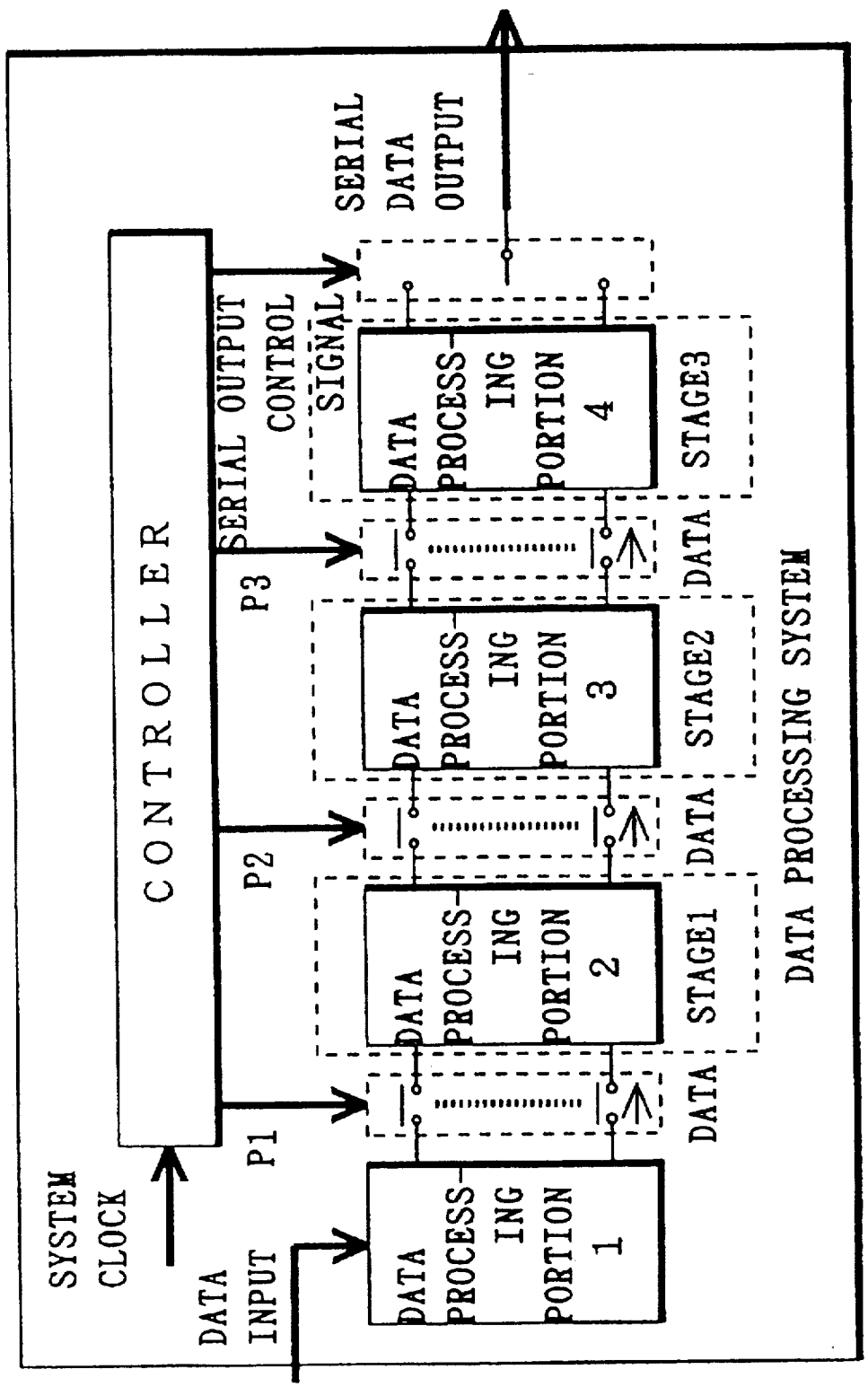
F I G. 28

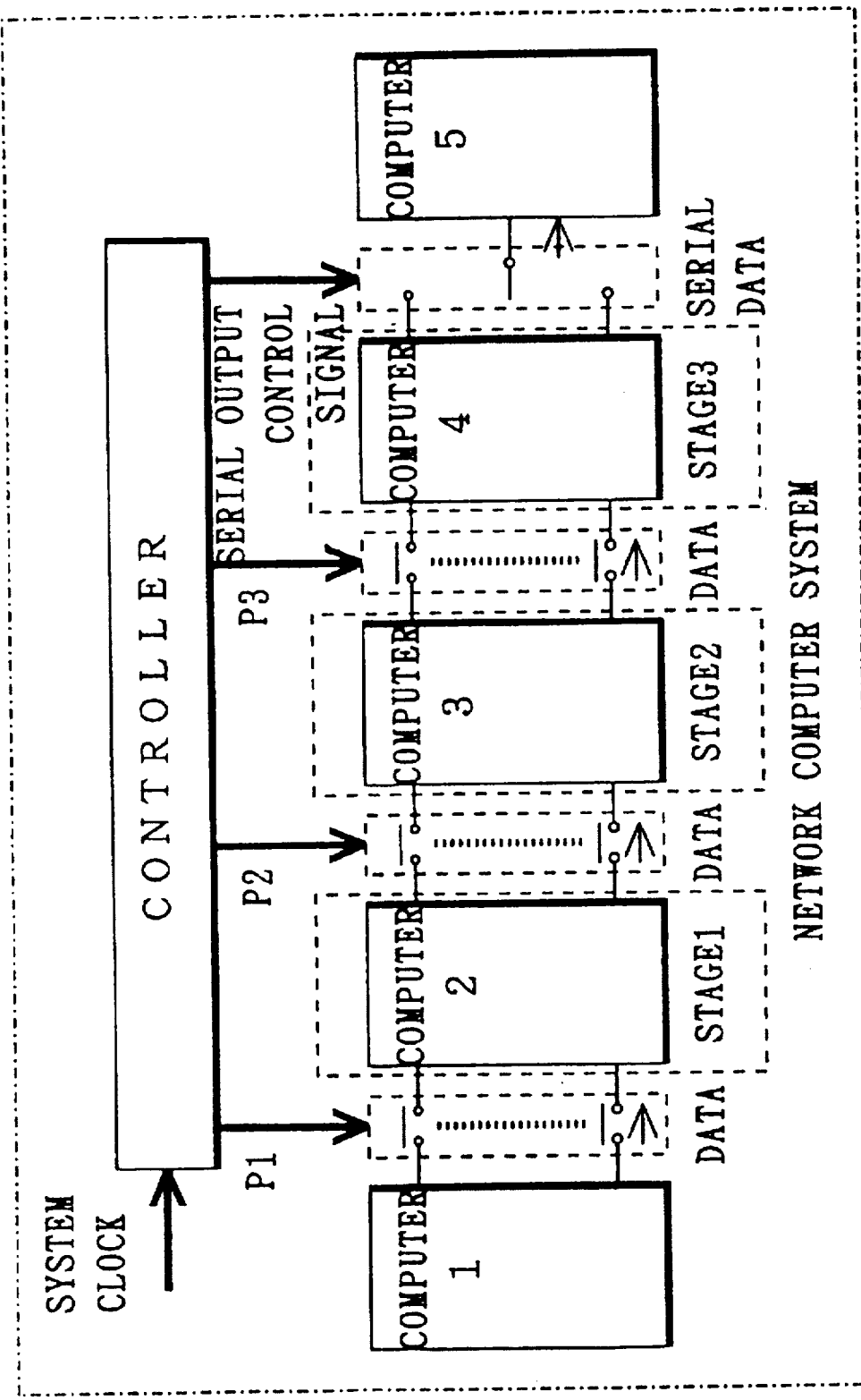
F I G. 29

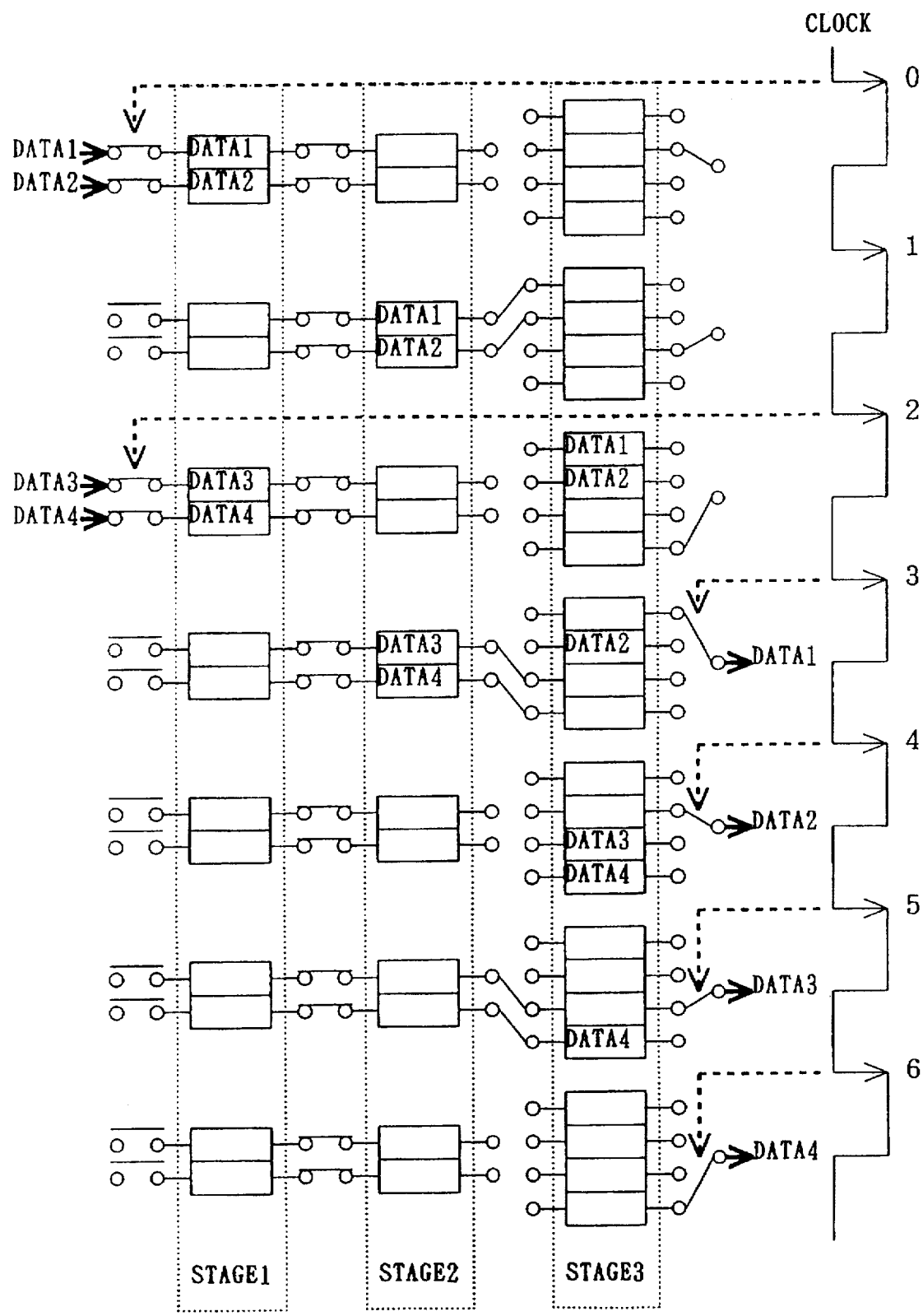
F I G. 30

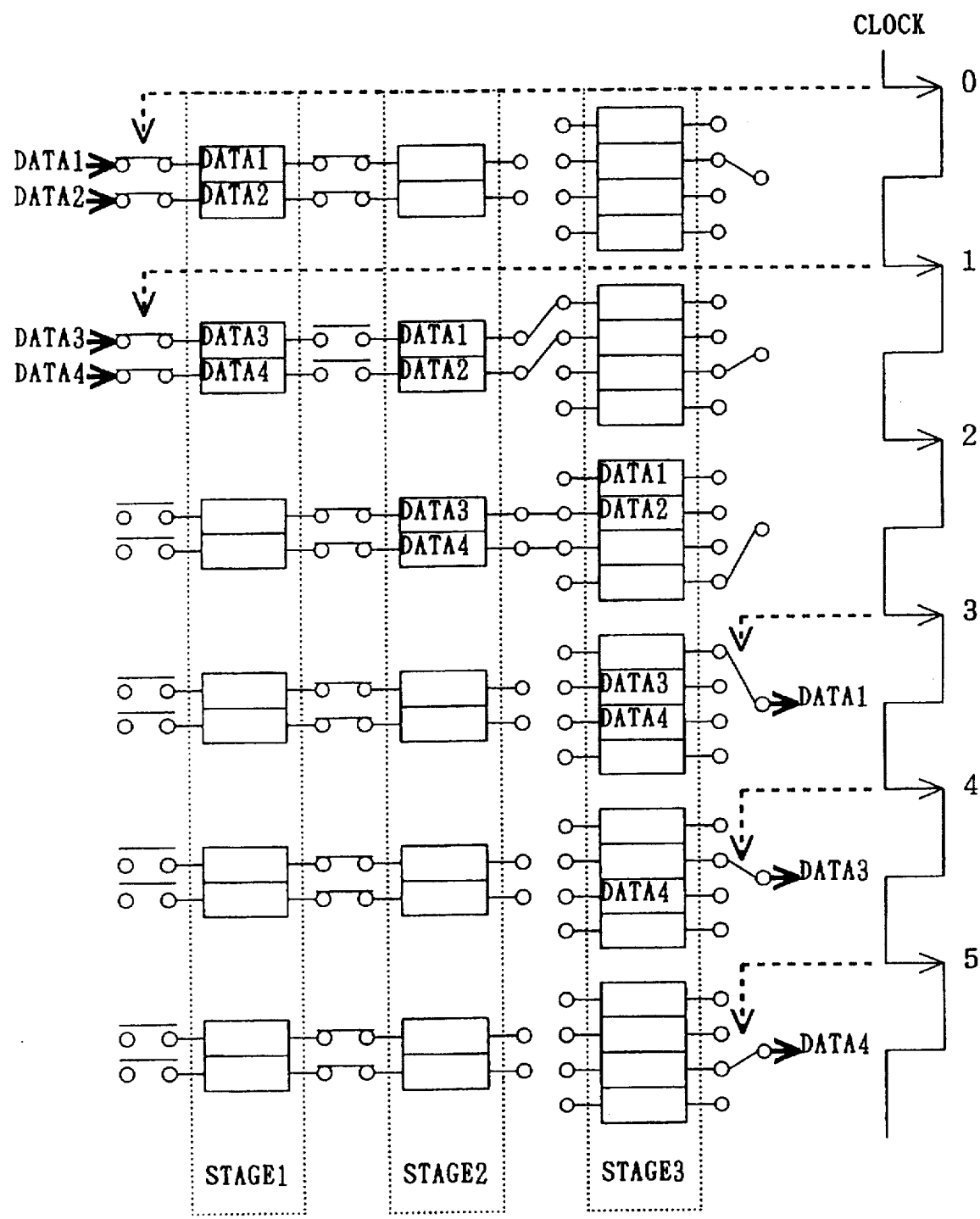
F I G. 31

DATA TRANSFER SYSTEM FOR TRANSFERRING DATA IN SYNCHRONIZATION WITH SYSTEM CLOCK AND SYNCHRONOUS SEMICONDUCTOR MEMORY

BACKGROUND OF THE INVENTION

1. Field of the Invention

This invention relates to a data transfer system for transferring data in synchronization with system clock and a synchronous semiconductor memory device.

2. Description of the Related Art

Modern semiconductor device systems have been improved so as to be capable of processing large quantity data and at high data processing speed.

With this situation, the data processing speed of MPUs is getting faster at a good pace. In contrast, the data processing speed of memory devices has been improved at a slower pace than the MPUs, although their storage capacity is getting larger at a good pace. As a result, the difference in data processing speed between the MPUs and the memory devices is steadily getting wider.

To eliminated such a difference in speed, a memory device has been developed which controls the operation of the system by a method different from the control method of conventional memory devices and thereby improves the data transfer rate. This is a synchronous memory device. A typical synchronous memory device is a dynamic RAM that is controlled in synchronization with the system clock.

Hereinafter, this type of dynamic RAM is referred to as a synchronous DRAM in this specification and is abbreviated as an SDRAM. The basic operation of an SDRAM has been disclosed in Jpn. Pat. Appln. KOKAI Publication No. 5-2873. A concrete SDRAM product was announced in SHINGAKU GIHO SDM93-142, ICD93-136 (1993-11).

In the present specification, explanation of the specifications for the SDRAM will not be given. What is important to the SDRAM is to read the serially accessed burst data as fast as possible. The specifications for the SDRAM and the architecture to realize them are roughly divided into those for a pipeline type and those for a register type.

Pipeline Type

FIG. 32 is a schematic diagram of a pipeline SDRAM.

A known memory cell array and a known sense amplifier 601 are used in FIG. 32, in which a small charge signal (data) from a series of cells connected to the selected word line is read onto a bit line and is amplified at the sense amplifier. To read the data held in the sense amplifier at high speed, a pipeline operation is used. The number of pipeline stages from the taking in of the address to the output of the data is three at most. FIG. 32 illustrates an SDRAM having three pipeline stages S1, S2, and S3.

As shown in FIG. 32, signals P1 and P2 are control signals which are driven in each cycle and used to control latch gates 603 and 605 that take in the data at the up edge of an external control clock CLK, hold it, and output it. The latch gates 603, 605 latch the input data at the up edges of the control signals P1, P2, hold them, and keep outputting them. Signal P3 is a control signal to control a conductive gate 607.

The three stages S1, S2, and S3 have the following functions.

(The first stage S1)

In stage S1, the starting address of a burst data access or an internal address (this address is indicated by Ai in the figure) generated inside the device in connection with the starting address is taken in response to control signal P1. The input address is decoded at an address decoder 609 to produce a signal for selecting access columns. To put it simply, the first stage is a stage in which the output of the address decoder is determined from the input address.

(The second stage S2)

In stage S2, the signal for selecting the access columns is latched and then, the access columns are selected and the data held in the sense amplifiers are sent to a local data bus (hereinafter, abbreviated as LDB). LDB is connected to all of the columns via the gates controlled by column selection signals used to select columns and sends only the data in the column selected. To put it simply, the second stage is a stage in which the data extracted according to the output of the determined address decoder is transferred to LDB.

(The third stage S3)

In stage S3, after the data transferred to LDB is allowed to conduct and is sensed at a data bus sense amplifier 611, it advances over a global data bus (hereinafter, abbreviated as GDB). Then, the data is outputted from an output buffer 613 (the output is indicated by Q in the figure). To put it simply, stage S3 is a stage in which the data transferred to LDB is outputted to outside the device.

FIG. 33 shows how the data advances in each stage in a pipeline SDRAM.

As shown in FIG. 33, if burst data access starts at a cycle indicated by arrow 615, the data will be transferred sequentially in each cycle in the individual stages S1, S2, and S3, so that all of the stages S1, S2, S3 will be activated in each cycle. Because address Ai may be arbitrary in each cycle, the data can be outputted randomly. The latency, or the number of cycles from the one where the address is taken in to the one where the data specified by the address is outputted must be at least three (in this case, the SDRAM is referred to as an SDRAM of latency 3).

Register Type

FIG. 34 is a schematic diagram of a register SDRAM.

FIG. 34 shows a register SDRAM that reads two bits simultaneously. As shown in FIG. 34, a memory cell array and a sense amplifier 601 are the same as those in the pipeline SDRAM. Unlike the pipeline SDRAM, the register SDRAM does not require clearly divided stages. To help understand the present invention, however, hypothetical stages are provided. The operation of a register SDRAM can be roughly divided into two stages S1 and S2. These two stages S1, S2 have the following functions.

(The first stage S1)

In stage S1, the starting address of the burst access data and the subsequent serial access address (these addresses are indicated by Ai in the figure) are taken in according to control signal P1. The taken-in address is decoded at an address decoder 709. Then, more than one column is selected and the data is transferred simultaneously from the columns onto LDB. To put it simply, the first stage is a stage in which the output of the address decoder is determined from the input address. The data extracted according to the output of the determined address decoder is transferred to LDB.

(The second stage S2)

In stage S2, two bits are selected from the data on LDB. These bits are sensed, transferred to GDB and stored in an output register 713. The stored data is outputted from the output register 713 in two cycles, one bit per cycle (the output is indicated by Q in the figure). To put it simply, the second stage is a stage in which the data transferred to LDB is outputted to outside the device.

FIG. 35 shows how the data advances in each stage in a register SDRAM.

As shown in FIG. 35, two cycles after the start of the burst, the data appears on LDB. The register type differs from the pipeline type in that a series of operations is determined by the data transfer capability and is not controlled by an external clock, or how data is transferred is not determined by one cycle. The transferred data is outputted in the third cycle and fourth cycle. In the meantime, the data in the next two cycles appears on LDB. As compared with the pipeline type, each stage operates once every two cycles. An address is internally generated every two cycles. The address can be updated every two cycles (which is known as the limited cycles)

SUMMARY OF THE INVENTION

As described above, the pipeline SDRAM and the register SDRAM have their respective inherent characteristics.

For instance, the pipeline SDRAM has a smaller number of circuits constituting a data transfer system, can be constructed relatively easily, and has flexibility in changing the access address. On the other hand, it cannot perform up to its capability at the maximum efficiency because the data transfer is divided forcibly by cycles. In addition, each stage operates every cycle, resulting in larger power consumption.

In contrast, with the register SDRAM, the data transfer is not divided forcibly by cycles, enabling more than one cycle to be used for data transfer, so that the data can be transferred in a manner that is best suited for internal operation. This enables the device to perform up to its capability at the maximum efficiency, which therefore is suitable for higher-speed operation. Furthermore, since each stage operates once every more than one cycle, the power consumption of the device is lower. On the other hand, however, with the register SDRAM, the change of the access address is restricted at regular intervals of more than one cycle unless the cycle time is doubled at the sacrifice of speed. In addition, since several circuits must be added to constitute a data transfer system, such as a register, the register SDRAM is more complicated in configuration than the pipeline SDRAM.

In FIG. 36, the data transfer in a pipeline SDRAM is compared with the data transfer in a register SDRAM.

In FIG. 36, P1, P2, and P3 indicate the starting cycles of the individual stages in the pipeline SDRAM.

As shown in FIG. 36, first, in cycle P1, an address is taken in and the output of the address decoder is determined. Up to this point, the pipeline type and the register type are the same. The pipeline SDRAM starts to operate at cycle P2 and has the second stage S2 shown in FIG. 32, whereas the register SDRAM does not have this stage. Because of this, the pipeline type differs from the register type in the decision timing of selecting a column select line CSL to transfer the data in a memory cell to LDB. Specifically, the decision timing in the pipeline type starts at cycle P2 in synchronization with the clock. In contrast, the decision timing in the register type is not restricted by cycle P2 and starts immediately after the output of the decoder has been almost determined in cycle P1. Once the selection of the column select line CSL has been determined, a column gate gets conductive, which allows the data to appear on LDB. This holds true in both of the pipeline type and the register type.

Finally, in cycle P3, data bus sensing is done and the data is outputted. This holds true in both of the pipeline type and the register type.

The pipeline SDRAM and register SDRAM compared with each other in FIG. 36 are what are called SDRAMs of latency "3", which output the data in the third cycle after the start of the access. Comparison of the pipeline type with the register type in SDRAMs of latency "3" shows that the register SDRAM has as much a margin as time T shown in FIG. 36. This is because in the pipeline type, the margins of all of the operations are determined in the margin of a stage having no leeway to operate within the cycle time, whereas in the register type, the same thing does not take place.

Accordingly, a first object of the present invention is to provide a synchronous semiconductor memory device and data transfer system that, although having an output register for serial data output, is capable of guiding an address to a data transfer path even in cycles other than the limited cycles and consumes less electric power.

A second object of the present invention is to provide a synchronous semiconductor memory device and data transfer system that is capable of serially outputting the data continuously from the output register, even an address is directed to a data transfer path in cycles other than the limited cycles.

A third object of the present invention is to provide a synchronous semiconductor memory device and data transfer system that, although having flexibility in changing the access address, is capable of increasing the efficiency of data transfer and consumes less electric power.

A fourth object of the present invention is to provide a method of operating a synchronous semiconductor memory device and data transfer system that is capable of directing an address to a data transfer path even in cycles other than the limited cycles.

In order to achieve the objects, according to present invention, a data transfer system for transferring data in synchronization with a clock, comprising: a data transfer path that is capable of transferring an a number of data items in parallel simultaneously and that includes pipeline division sections, which can be divided into an N number of pipeline stages, each of the N divided pipeline stages temporarily holding data; and a control section for controlling the pipeline stage division sections, wherein the control section connects (n−1) divisions (n=a/m: m is the number of cycles necessary for data transfer between the divided pipeline stages adjacent to each other) out of n (=N−1) of the pipeline division sections, not separating all of the N pipeline stages from each other, when the transfer of the a number of data items is started in a cycle corresponding to an a cycle, and activates all of the n pipeline division sections, separating all of the N pipeline stages from each other, when the transfer of the a number of data items is started in a cycle different from the a cycle.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a circuit diagram of the SDRAM of FIG. 1;

FIG. 9 is a circuit diagram of the basic control signal generator circuit;

FIG. 10 is a circuit diagram of the latch circuit;

FIG. 11 is a circuit diagram of the address reset sensing circuit;

FIG. 12 is a circuit diagram of the transfer signal generator circuit;

FIG. 13 is a circuit diagram of an even-numbered cycle and odd-numbered cycle judging circuit;

FIG. 17 shows the correspondence between the address buses AB1, AB2 and the LDB, low-order bits A0, A1;

FIG. 18 shows the selection relationship between CSL and LDB;

FIG. 26 is an operating waveform diagram of the circuitry around the output register;

FIG. 27 is a block diagram showing the SDRAM of FIG. 1 in greater detail;

FIG. 28 is a block diagram of a data-processing system which incorporates the data-transfer system provided in the SDRAM according to the embodiment of the present invention;

FIG. 29 is a block diagram of a network computer system which incorporates the data-transfer system provided in the SDRAM according to the embodiment of the present invention;

FIG. 30 is a diagram illustrating a condition in which data is transferred in the SDRAM shown in FIG. 27;

FIG. 31 is a diagram showing another condition in which data is transferred in the SDRAM shown in FIG. 27;

DETAILED DESCRIPTION OF THE PREFERRED EMBODIMENTS

Hereinafter, embodiments of the present invention will be explained. In the explanation below, the same parts will be shown by the same reference symbols throughout all of the accompanying drawings and repetitious explanation will be avoided.

Figure 1:
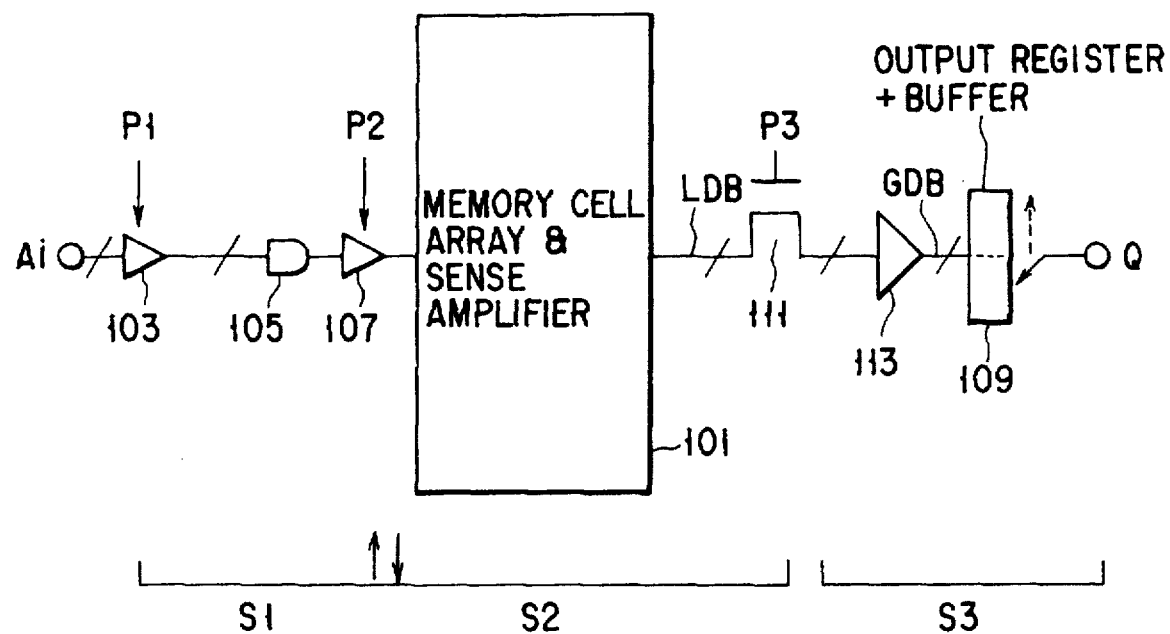
FIG. 1 is a schematic diagram of an SDRAM according to an embodiment of the present invention.

FIG. 1 is a schematic diagram of an SDRAM according to an embodiment of the present invention.

As shown in FIG. 1, the SDRAM according to the embodiment of the present invention basically comprises: a memory array includes memory cells and sense amplifiers and column gate 101; a latch gate (a column address buffer) 103 that takes in address Ai from the outside at the up edge of a control clock (a system clock) CLK externally supplied, latches address Ai, and outputs it (column address signals); an address decoder (a column decoder) 105 that decodes the column address signals outputted from the latch gate 103 and output a signal for selecting a column in the memory cell array to the column gates; a latch gate 107 that is connected to the output terminal of the address decoder 105, latches the output of the address decoder 105 in response to control signal P2, and outputs it; a local data bus (DQ lines) LDB connected to the bit lines of the memory cell array; a conductive gate 111 provided in a column local data bus LDB; a data bus sense circuit (DQ gate) 113 that is provided between the local data bus LDB and a global data bus (RWD lines) GDB, sense-amplifies the data read onto the local data bus LDB, and transmits the amplified signal to the global data bus GDB; and an output register 109 that is connected to the global data bus GDB, stores the data appearing on the global data bus GDB, and outputs it.

Figure 32:
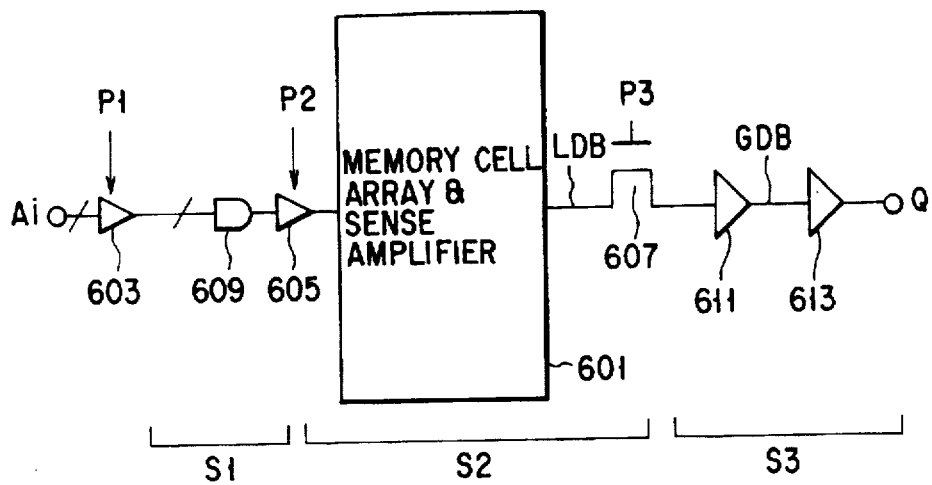
FIG. 32 is a schematic diagram of a pipeline SDRAM.
Figure 33:
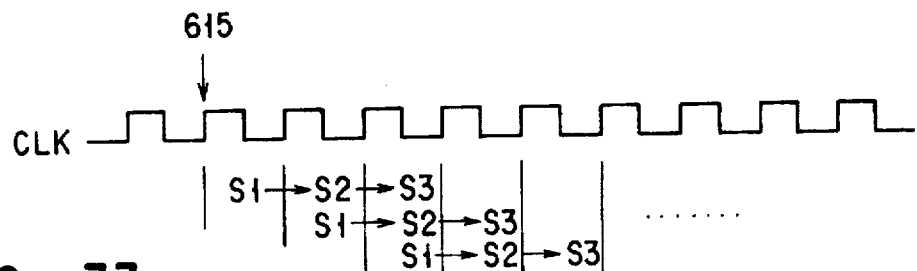
FIG. 33 shows the way in which the data moves on in the pipeline SDRAM.
Figure 34:
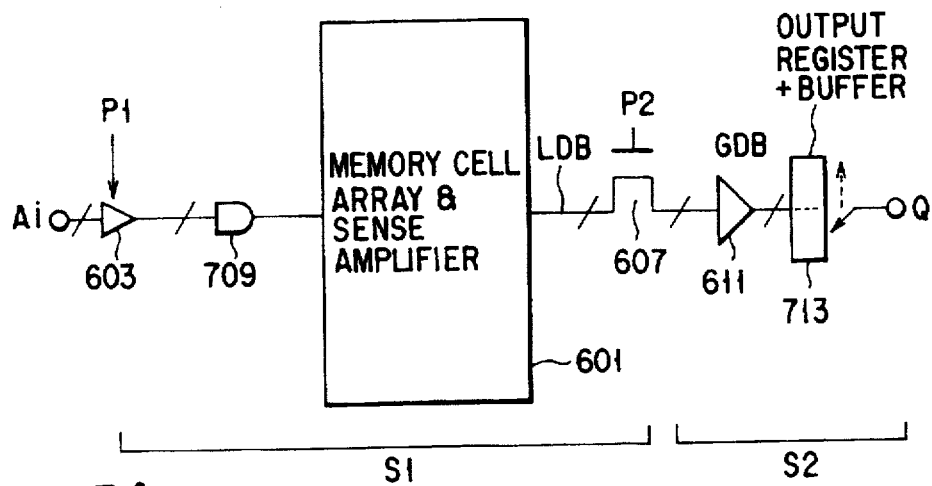
FIG. 34 is a schematic diagram of a register SDRAM.
Figure 35:
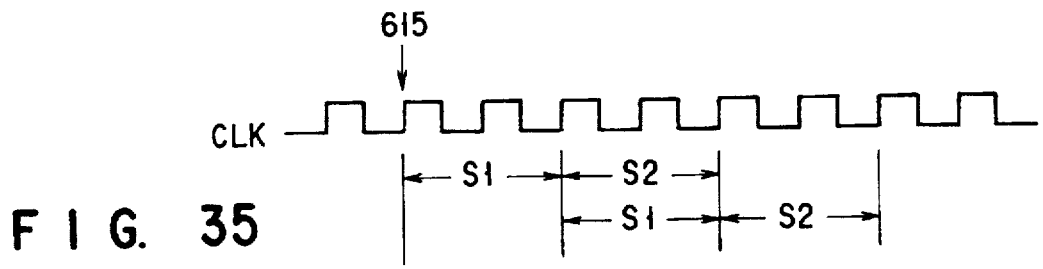
FIG. 35 shows the way in which the data moves on in the register SDRAM.
Figure 36:
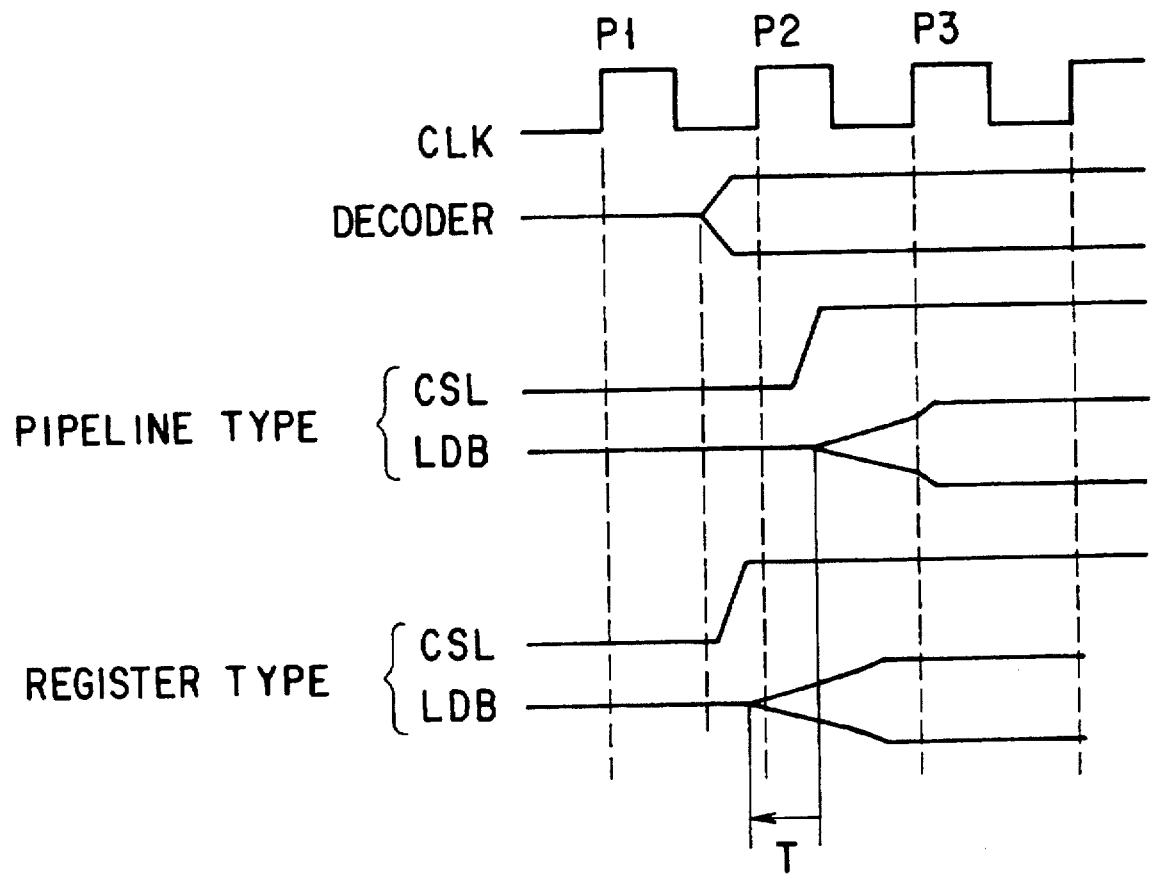
FIG. 36 shows the comparison of the data transfer in the pipeline SDRAM with the data transfer in the register SDRAM.

The SDRAM shown in FIG. 1 includes almost the same blocks as in the SDRAMs shown in FIGS. 32 and 34. The SDRAM system as a whole is based on the register type but differs from a conventional SDRAM in the timing with which the data transfer stages (pipeline stages) are operated.

In the SDRAM of FIG. 1, a first pipeline stage S1 and a second pipeline stage S2 are separated from each other only in a special case. In cases other than the special case, the first pipeline stage S1 and the second pipeline stage are connected together to form a single pipeline stage. The latch gate 107 operates so as to separate the first pipeline stage S1 from the second pipeline stage S2 only in the special case and to get the first pipeline stage S1 and the second pipeline stage S2 connected through in cases other than the special case. The latch gate 107 is controlled by a control signal P2.

Next, the operation of the SDRAM of FIG. 1 will be explained.

Figure 2A:
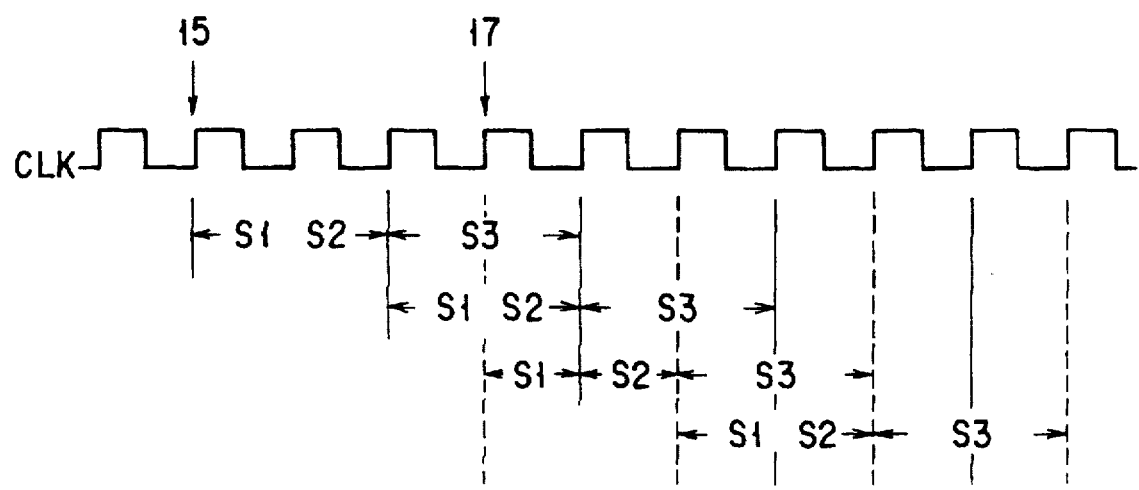
FIG. 2A shows the way in which the data moves on in the SDRAM of the embodiment.

FIG. 2A illustrates the operation of the SDRAM of FIG. 1, particularly the way that the data is transferred in the pipeline stages.

As shown in FIG. 2A, it is assumed that a burst access starts in a cycle having the up edge of the clock indicated by arrow 15 as a starting point and a new address is set in a cycle having the up edge of the clock indicated by arrow 17 as a starting point. The cycle using the edge indicated by arrow 17 as a starting point is the cycle in which a new address is inhibited from being set in the register type of FIG. 34.

With the SDRAM of FIG. 1, if a new address is set in a cycle in which a new address was inhibited from being set in the prior art (hereinafter, this cycle is referred to as the inhibit cycle), control signal P2 will be outputted, which will activate the latch gate 107, thereby separating the first pipeline stage S1 from the second pipeline stage S2. This will causes the pipeline stages to consist of three stages, S1, S2, and S3. These three stages S1, S2, S3 operate independently. Independent operation of the three stages S1, S2, S3 prevents the data before the setting of the new address from being destroyed by the data from the new address. In addition, the data before the setting of the new address continues being transferred in the device. Then, after the data before the setting of the new address has been outputted, the data from the new address is outputted continuously from the output register 109.

The output speed of such data is the same as that of the pipeline SDRAM. The two cycles separated by the solid lines in FIG. 2A show the original operation timing in the SDRAM of FIG. 1. The operation timing after the setting of the new address is shifted by one cycle from the original operation timing, resulting in two-cycle operations separated by the dotted lines.

FIG. 3 is a circuit diagram of the SDRAM of FIG. 1.

As shown in FIG. 3, the latch gate 103, in response to control signal P1, takes in address Ai and latches it. The taken-in address is decoded at the address decoder 105 and two adjacent column select lines CSL are selected. The column select signal outputted from the address decoder 105 is designed to be outputted from the latch gate 107 in a cycle next to the cycle in which the address has been taken in. As described earlier, the latch gate 107 is activated only when a new address has been set in a specific cycle, that is, an inhibit cycle. In cycles other than the inhibit cycles, the column select signal goes through the latch gate 107. The potentials of the two adjacent column select lines CSL go high. the data already read from the memory cell and held in the sense amplifier appears on four pairs of local data buses LDB. In the SDRAM shown in FIG. 3, two cycles are used, starting count from the cycle in which the address has been set, until the data has been put on the local data bus LDB.

After the data has been put on the local data bus LDB, two of the four pairs of local data buses are selected. The data in the selected two pairs of local data buses LDB is amplified and transferred to two pairs of global data buses GDB. For this operation, a data bus sense circuit 113 with a selecting function is used. The data transferred to the global data bus GDB is further transferred to an output register 109. In this case, the data is set at a scrambler 115 so as to be suitable for serial accessing and the resulting data is supplied to the output register 109. Two bits are stored in each of two registers R1 and R2 (or registers R3 and R4) included in the output register 109. The data stored in the registers R1, R2 (or registers R3, R4) is outputted bit by bit. During the time from when the data is put on the local data bus LDB until it has been outputted from the output register 109, two cycles, the third and fourth cycles, are used, counting from the cycle in which the address has been set.

In the SDRAM of FIG. 3, such an operation is repeated at regular intervals of two cycles as shown in FIG. 2A. When a new address is set in a cycle (or an inhibit cycle) departing from the intervals of two cycles, control signal P2 activates the latch gate 107, allowing the data before the setting of the new address to be put on the local data bus LDB. At the same time, the newly set address is decoded.

By operating the SDRAM this way, the data before the setting of the new address is prevented from being destroyed by the data from the new address. Namely, a new address can be set even in a cycle in which a new address was inhibited from being set in the prior art. This reduces limitations on the timing of entering an address.

Figure 2B:
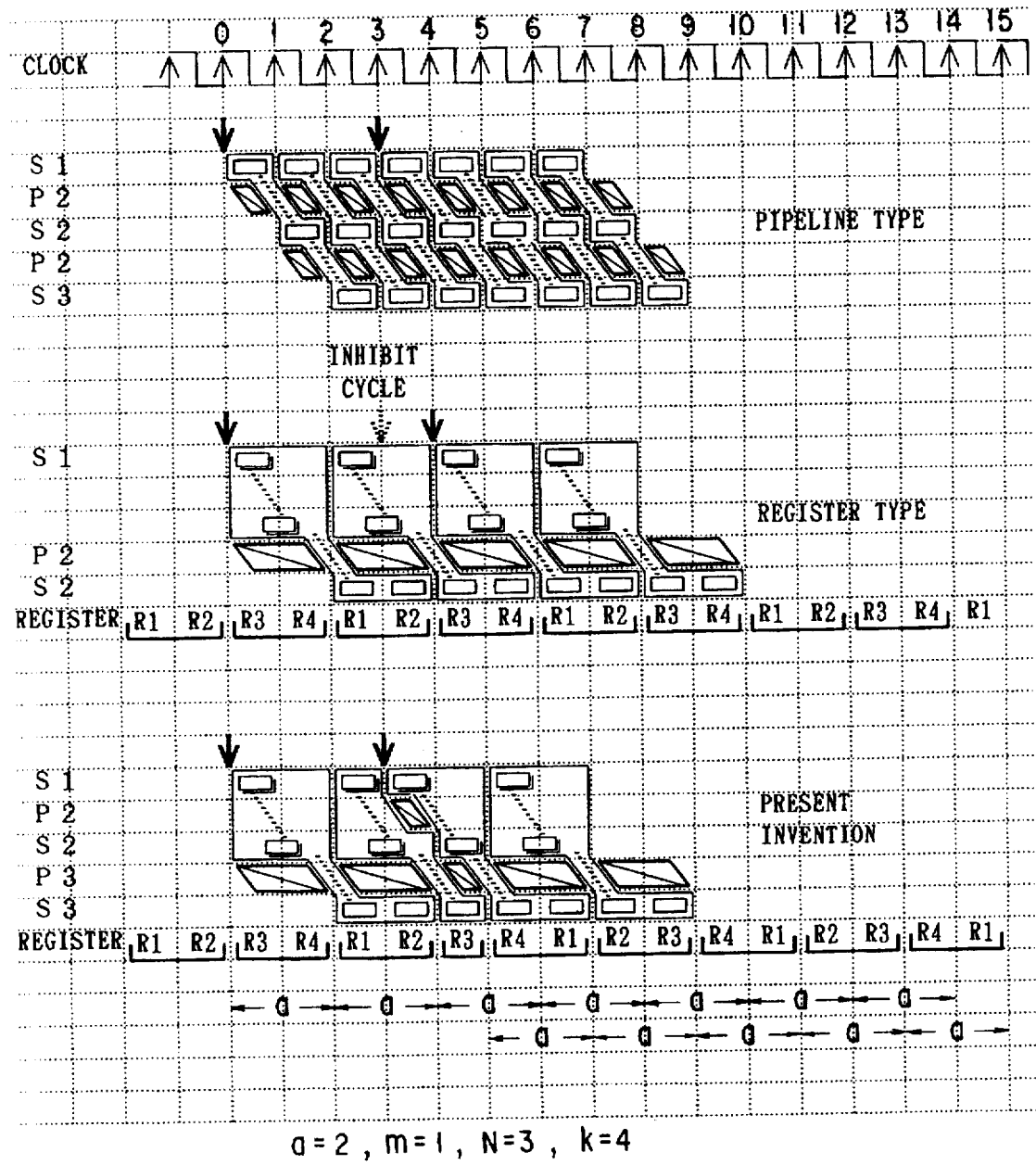
FIG. 2B shows the comparison between the data flow in the SDRAM of the embodiment, the data flow in a pipeline SDRAM, and the data flow in a register SDRAM.

FIG. 2B shows the comparison between the data flow in the SDRAM of the embodiment, the data flow in a pipeline SDRAM, and the data flow in a register SDRAM.

As shown in FIG. 2B, with the SDRAM of the embodiment, a new address can be set even in a cycle in which a new address was inhibited from being set in a conventional register SDRAM.

In FIG. 2B, an example with a burst length of 4 is shown.

The SDRAM of the embodiment conforms to a conventional register SDRAM in the operation ranging from the address setting to the data output, and consumes less electric power than a conventional pipeline SDRAM.

Furthermore, with the SDRAM of the embodiment, the data items are outputted from the registers R1 to R4 contained in the output register 109 one by one from cycle to cycle in specific order, which realizes high-speed serial access.

With the method of outputting the data items one by one in the specific order from the registers R1 to R4, however, when a new address has been set in a cycle departing from the intervals of two cycles, the period in which the data is stored in the output register 109 may depart from the intervals of two cycles. This situation is shown in FIG. 2B. A method of coping with the departure of the period of storing data will be explained later.

Next, a method of raising the potentials of two adjacent column select lines will be described.

Figure 4:
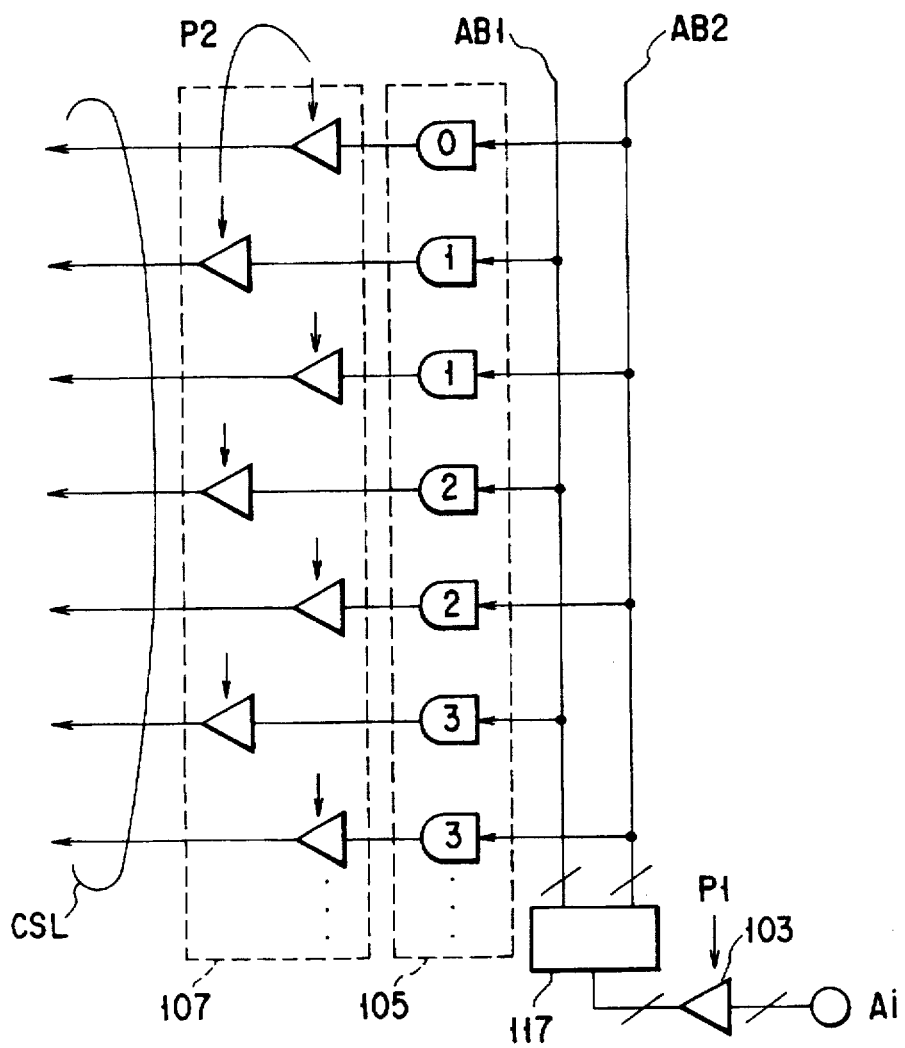
FIG. 4 is a circuit diagram of the decoder.

FIG. 4 is a circuit diagram of the address decoder 105 and its related circuitry.

As shown in FIG. 4, address buses AB1 and AB2 are provided. The lowest-order bit A0 of an address in the address bus AB1 and the lowest-bit A0 of an address in the address bus AB2 correspond to "0" and "1", respectively. Address bits sent to another address bus are of higher order. An address generator circuit 117 produces an address equal to the address latched in the latch gate 103 plus "1." The address generator circuit 117 sends the 1-added address and the address latched in the latch gate 103 to the address bus AB1 and address bus AB2, respectively. This causes two adjacent column select lines CSLs to go high.

In the address decoder 105, the component parts assigned the same numerals decode the same way. The component parts are arranged so that an address may become larger. The latch gate 107 to which the control signal P2 is inputted is connected to the column select lines CSLs connected to the output of the address decoder 105, and latches the data as the need arises.

While in FIGS. 3 and 4, adjacent CSLs are selected, they are not necessarily arranged side by side physically, but have only to be arranged side by side in the addressing space.

When a new address has been set in a cycle departing from the intervals of two cycles, the latch gate 107 is activated and a pipeline operation is carried out in each cycle temporarily. At this time, the period in which the data is stored in the output register 109 may depart from the period of storage at the intervals of two cycles and fall into disorder. A measure to cope with the disorder of the period of storing data must be taken.

Figures 5A, 5B:
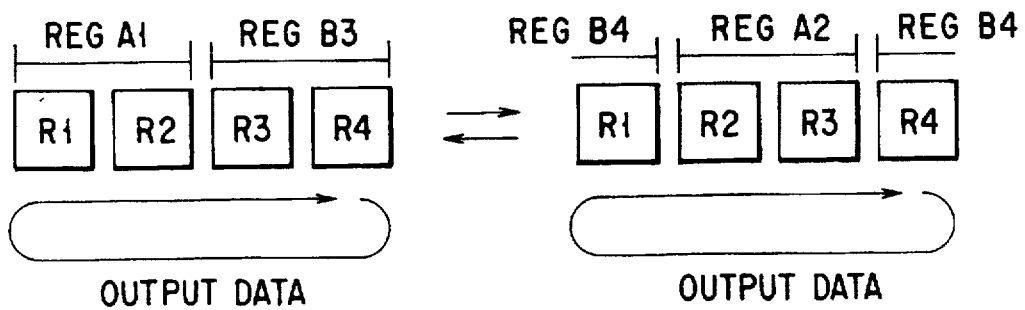
FIG. 5A illustrates a state of the output register.
FIG. 5B illustrates another state of the output register.

FIGS. 5A and 5B are schematic diagrams of an output register designed to cope with the disorder of the period in which the data is stored in the output register 109. FIG. 5A shows a state of the register and FIG. 5B shows another state of the register.

As shown in FIGS. 5A and 5B, the signal outputted as the output data is obtained by scanning the output registers R1 to R4 in specific sequence. The scanning sequence of the output registers R1 to R4 is not ruined or skipped, even if a new address has been set. By neither ruining nor skipping the scanning sequence, extra time, such as addressing change time, is not required between data output cycles, which makes it possible to output the data in faster cycles.

First, as shown in FIG. 5A, it is assumed that two bits of data are stored in output register R1 and output register R2 (REGA1 in the figure) and register R3 and register R4 (REGB3 in the figure), respectively.

In the first two cycles, two bits of data are stored in the REGA gate side and in the next two cycles, the next two bits are stored in the REGB gate side. It is assumed that in the course of the storage period every two cycles, a new address has been set in a cycle departing from the storage period. In this case, the data corresponding to the newly set address will appear on the global data bus GDB. For instance, the data outputted from the output register R2 after the data has been outputted from the output register R1 will be the data corresponding to the newly set address. Then, the division of data storage will change as shown in FIG. 5B.

After the data corresponding to the newly set address has appeared on the global data bus GDB, in the first two cycles, the data is stored in output register R2 and output register R3 (REGA2 in the figure) and in the next two cycles, the data is stored in output register R4 and output register R1 (REGB4 in the figure).

When the data corresponding to the newly set address has appeared on the global data bus GDB in synchronization with the storage period every two cycles, the division of the REGA side gate and that of the REGB side are not changed. Only when the data corresponding to the newly set address has appeared on the global data bus GDB in a cycle departing from the storage period every two cycles, the divisions of the REGA side gate and REGB side gate are changed from FIG. 5A to FIG. 5B or from FIG. 5B to FIG. 5A.

As described above, when the data corresponding to the newly set address has appeared on the global data bus GDB in a cycle departing from the storage period every two cycles, serial accessing can be done, regardless of the setting of the new address, by changing the way of dividing the registers R1 to R4 so as to cause the data to be always outputted from the registers R1 to R4 in sequence, without ruining or skipping the scanning sequence of the registers R1 to R4. This makes it possible to always output the data in high-speed cycles.

Figure 6:
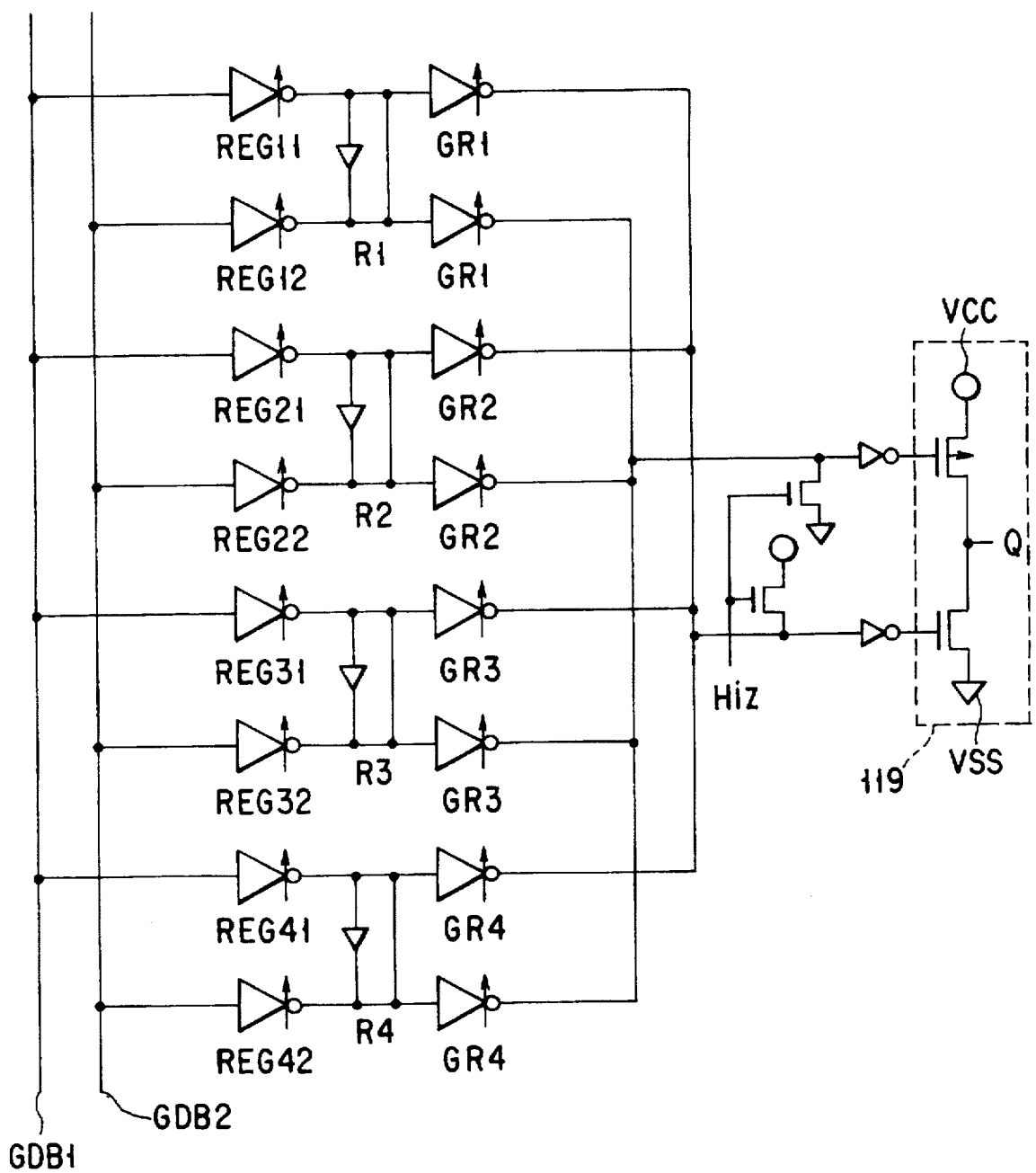
FIG. 6 is a circuit diagram of the output register.

FIG. 6 is a circuit diagram of the output register 109 of FIGS. 5A and 5B.

As shown in FIG. 6, the data is outputted at a terminal Q. When a signal HiZ goes high, which turns off an output transistor 119, making the terminal Q of high impedance. The data stored in the output registers R1 to R4 is outputted to the terminal Q by gate signals GR1 to GR4 going high sequentially and cyclically and thereby making the clocked inverters conductive.

In FIG. 6, what constitute the gate REGA and REGB are transfer gates REG11 to REG42. For example, the transfer gates REG11 to REG42 are clocked inverters as shown in FIG. 6. Of the data appeared on the four pairs of local data buses LDB, the selected data is transferred to the global data buses GDB1 and GDB2.

Explained next will be the entire data transfer control in the SDRAM of the embodiment.

Figure 7:
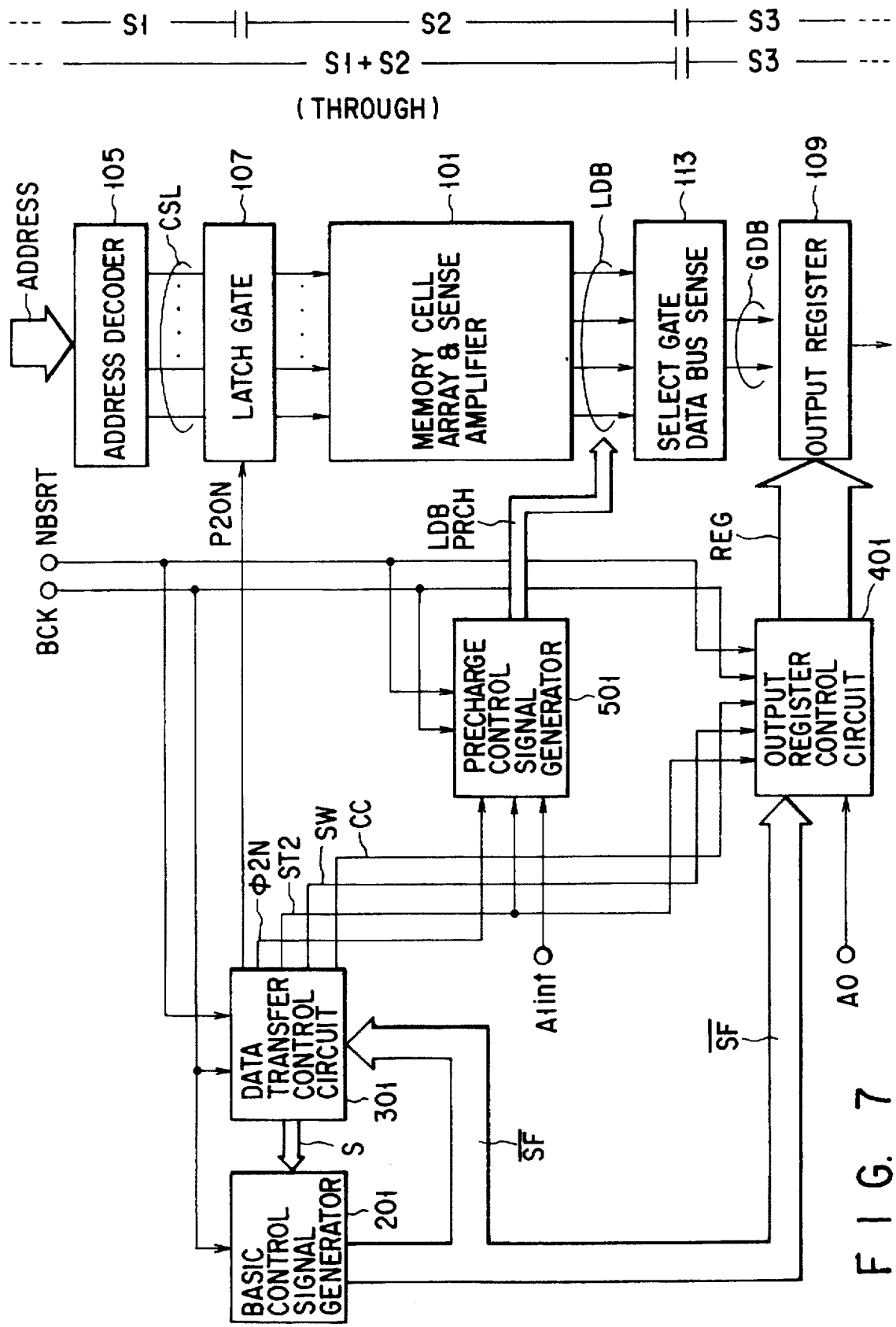
FIG. 7 is a block diagram of the data transfer control circuit.

FIG. 7 is a block diagram of the data transfer control route circuit included in the SDRAM of the embodiment.

As shown in FIG. 7, the data transfer control route circuit operates in synchronization with an internal clock (hereinafter, a burst clock) BCK produced on the basis of an external clock and controls data transfer so that the data transfer may synchronize with the burst clock BCK. The burst clock is generated at the start of a burst. A signal NBSRT (hereinafter, referred to as a new burst start signal) indicating that a new burst has been started is inputted to the data transfer control route circuit. The data transfer control route circuit generates a group of signals for controlling the data transfer largely on the basis of the burst clock BCK and the new burst start signal NBSRT.

The data transfer control route circuit basically comprises: a basic control signal generator circuit 201 that generates a basic control signal group /SF (here, / means "–(bar)" indicating an inverted signal or a negative logic signal. In the figure, "–(bar)" is put above the symbol) corresponding to the number of cycles from the start of the first burst in synchronization with burst clock BCK; a data transfer control circuit 301 that generates a divide instruction signal P2ON for dividing the pipeline stages, a signal ø2N for telling whether the cycle is an even-numbered cycle or an odd-numbered cycle, counting from the start of the first burst, and control signal groups S, ST2, SW, CC for telling whether the new burst has started in an odd-numbered cycle or an even-numbered cycle in synchronization with the burst clock BCK and in response to the new burst start signal NBSRT and basic control signal group /SF; an output register control circuit 401 that generates a select control signal group REG for selecting and controlling the output register 109 on the basis of the new burst start signal NBSRT, signals ST2, SW, CC, basic control signal group /SF, and the lowest-order bit A0 of the address in synchronization with the burst clock BCK; and a precharge control signal generator circuit 501 that generates an LDB precharge control signal group LDBPRCH for controlling the precharging of LDB on the basis of the new burst start signal NBSRT, signals ST2, ø2, and the initial value A1int of bit A1 of the address in synchronization with the burst clock BCK.

Figure 8:
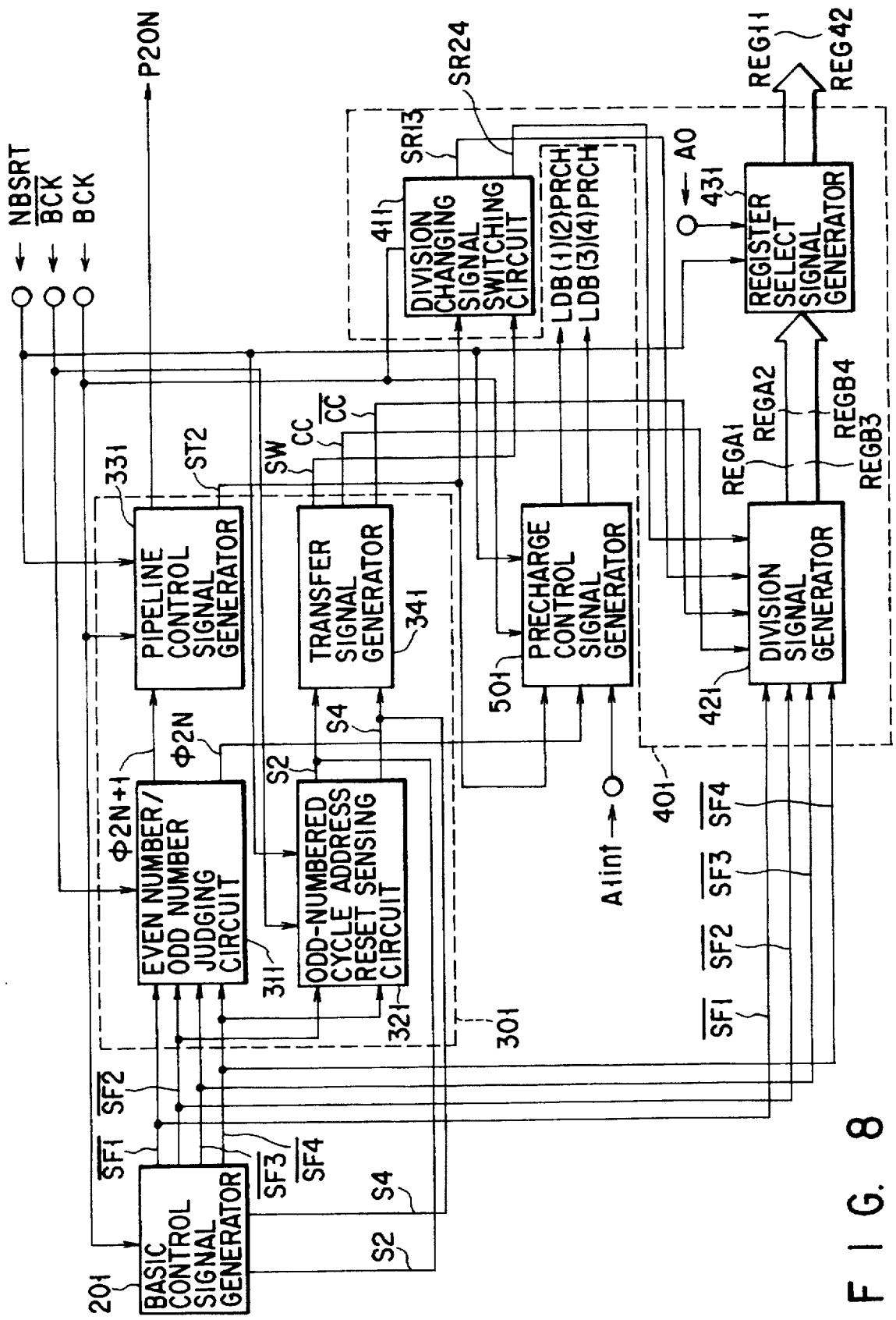
FIG. 8 is a detailed block diagram of FIG. 7.

FIG. 8 is a more detailed block diagram of the block diagram of FIG. 7.

As shown in FIG. 8, the data transfer control circuit 301 comprises: an even-number/odd-number judging circuit 311 that outputs a signal ø2N for indicating an even-numbered cycle and a signal ø2N+1 for indicating an odd-numbered cycle in synchronization with the inverted burst clock /BCK and in response to a basic control signal group /SF1 to /SF4, the even number and odd number being determined by counting from the start of the first burst; an odd-numbered cycle address reset sensing circuit 321 that outputs a signal S2 and a signal S4 that tell that the address has been reset in an odd-numbered cycle in synchronization with the inverted burst clock /BCK and in response to a basic control signal /SF2, a basic control signal /SF4, and the new burst start signal NBSRT; a pipeline control signal generator circuit 331 that outputs a divide instruction signal P2ON and a control signal ST2 in synchronization with the burst clock BCK and in response to the signal ø2N+1 and the new burst start signal NBSRT; and a transfer signal generator circuit 341 that outputs control signals SW, CC, /CC in response to signal S2 and signal S4.

The output register 401 comprises: a division changing signal switching circuit 411 that outputs division changing signals SR13 and SR24 for giving instructions to change the combinations of output registers in synchronization with the burst clock BCK and in response to control signal ST2 and control signal SW; a division changing signal generator circuit 421 that outputs division signal groups REGA1 to REGB4 in response to the division changing signals SR13, SR24, basic control signal groups /SF1 to /SF4, and control signals CC, /CC; and an output register select signal generator circuit 431 that outputs select control signal groups REG11 to REG42 in response to the division signal groups REGA1 to REGB4, new burst start signal NBSRT, and the lowest-order bit A0 of the address.

Next, each circuit will be explained in detail.

FIG. 9 is a circuit diagram of an example of the basic control signal generator circuit 201.

As shown in FIG. 9, the example of the basic control signal generator circuit 201 is a circulating shift register in which four stages of latch circuits 203 synchronizing with the burst clock BCK are connected in a ring.

FIG. 10 is a circuit diagram of the latch circuit 203 of FIG. 9.

The basic operation of the latch circuit 203 of FIG. 10 is as follows. First, when the burst clock BCK goes high, causing the latch circuit 203 to latch the data supplied to the input IN and output it at the output OUT. When the burst clock BCK goes low, the latch circuit 203 continues outputting the latched data at the output OUT, whereas the first-stage latch circuit 203-1 receives a new data input at the input IN.

The shift register of FIG. 9 is driven by the burst clock BCK generated only in a cycle in which data transfer is carried out. In the reset state, the output signal /SF1 is at a low level and the output signal /SF2 to the signal /SF4 are at a high level. Each time a cycle of burst clock BCK takes place, the low-level output is shifted from the first output signal /SF1 to the fourth output signal /SF4. After the data burst transfer operation has started, in an even-numbered cycle, the second output signal /SF2 or the fourth output signal /SF4 is at a low level. When the starting address of a new burst is set again in an odd-numbered cycle, the signal S2 or signal S4 inputted to the gate of transistor 205-2 or 205-4 connected to the second output signal /SF2 or fourth output signal /SF4 goes high, placing the second output signal /SF2 or the fourth output signal /SF4 at a low level. From this time on, a new burst shift cycle starts.

In the present specification, the first cycle in a burst is determined to be the 0-th cycle, followed by the first cycle, the second cycle, . . . . . The 0-th cycle, second cycle, fourth cycle, . . . are defined as even-numbered cycles and the first cycle, third cycle, . . . are defined as odd-numbered cycles.

FIG. 11 is a circuit diagram of the odd-numbered cycle address reset sensing circuit 321. FIG. 12 is a circuit diagram of the transfer signal generator circuit 341.

The sensing circuit 321 of FIG. 11 determines which cycle in the shift register of FIG. 9 the cycle of a new burst set in an (odd number)-th place corresponds to. If a new burst is started in a cycle next to the cycle in which the second output signal /SF2 is at a low level, the signal S2 will go high at the beginning of the cycle, because the signal NBSRT goes high at the beginning of the cycle. If a new burst is started in a cycle next to the cycle in which the fourth output signal /SF4 is at a low level, the signal S4 will go high at the beginning of the cycle, because the signal NBSRT goes high at the beginning of the cycle. The signals S2, S4 set the shift register of FIG. 9 in the cycles in which the signals has gone high, placing the second output signal /SF2 or the fourth output signal /SF4 at a low level and thereby starting a new cycle of the shift register.

In the circuit of FIG. 12, signal S2 or signal S4 first goes high, placing node SW at a high level. The initial state of node SW is at a low level. When signal S2 or signal S4 goes high in the second time, this causes node SW to go low. Thereafter, each time signal S2 or signal S4 goes high, node SW changes from high to low and from low to high in that order.

The initial state of the node CC of the circuit of FIG. 12 is at a high level. Each time node SW change from a high to a low level, node CC changes from low to high and then from high to low. Node /CC is a complementary node of node CC. From node /CC, an signal obtained by inverting the level of node CC is drawn. The signals drawn from these node CC and node /CC are used to control the changing of the data storage division of the output register shown in FIGS. 5A and 5B. The details of it will be described later.

FIG. 13 is a circuit diagram of an example of the even-numbered cycle/odd-numbered cycle judging circuit 311.

The circuit 311' of FIG. 13 judges whether the cycle is an even-numbered cycle or an odd-numbered cycle by comparing the lowest-order bit A0 of the address with the output A0int from the internal counter, because the burst access is serial.

As shown in FIG. 13, with the circuit 311', the lowest-order bit A0 of the address is latched at the start of a new burst access. When the signal NBSRT specifying the start of a new burst goes low, this causes A0 to be latched at node N1. Then, A0 is compared with output A0int from an internal counter. The initial value of node N1 and that of the internal counter output A0int are set so that they may be unequal to each other. After the operation has been started, the initial values change according to the signal /NBSRT and the internal counter output A0int. For instance, signal ø2N+1 goes low at the rising of the burst clock signal BCK in the first cycle and goes high in the next rising because the value of node N1 coincides with the value of the internal counter output A0int. At the rising of the burst clock signal BCK, the signal indicating whether the cycle is an even-numbered cycle or an odd-numbered cycle, counting from the first cycle in the burst, is always at a high level.

Figure 14:
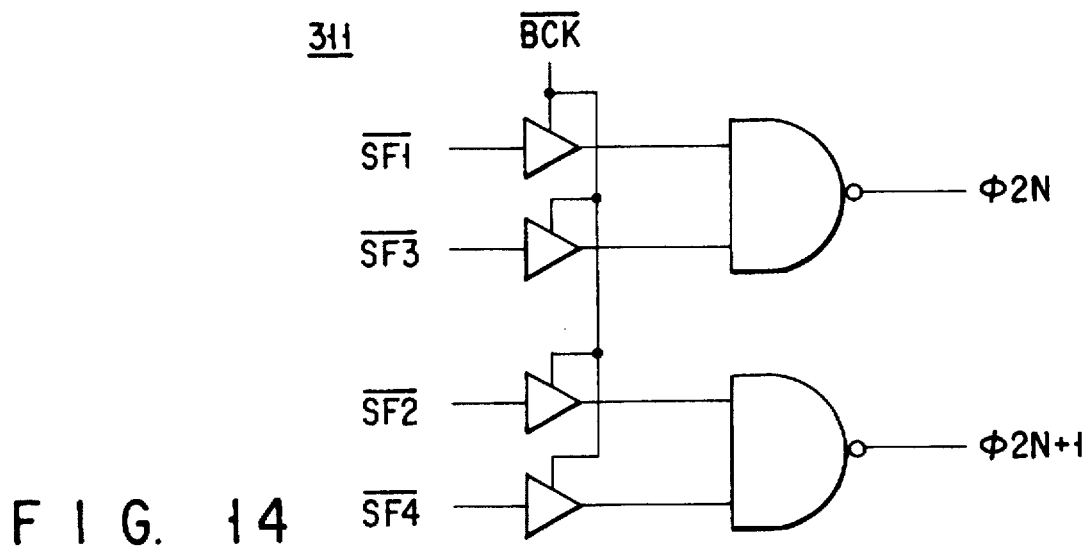
FIG. 14 is another circuit diagram of an even-numbered cycle and odd-numbered cycle judging circuit.

FIG. 14 is a circuit diagram of another example of the even-numbered cycle/odd-numbered cycle judging circuit 311.

The circuit 311 of FIG. 14 judges whether the cycle is an even-numbered cycle or an odd-numbered cycle by using the basic control signal group /SF as shown in FIGS. 7 an 8.

An advantage of the circuit 311 is that unlike the circuit 311' of FIG. 13, the circuit 311 does not use the state of the lowest-order bit of the burst access addressing. Signal /SF1 to signal /SF4 go low in sequence only on the basis of the number of cycles of the burst clock BCK. Therefore, in even-numbered cycles, signal /SF2 and signal /SF4 go low, whereas in odd-numbered cycles, signal /SF1 and /SF3 go low. In the circuit 311 of FIG. 14, these signals are latched at the falling of the burst clock BCK in the latter half of the cycle, which enables a signal indicating whether the cycle is an even-numbered or odd-numbered cycle to be produced at the rising of the burst clock signal BCK.

Figure 15:
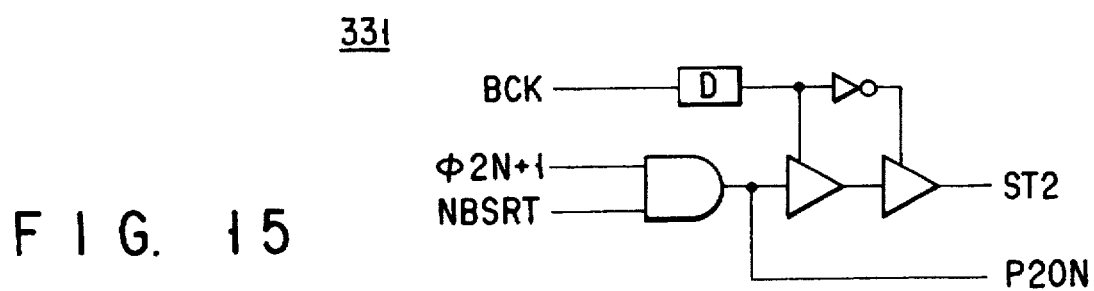
FIG. 15 is a circuit diagram of the pipeline control signal generator circuit.

FIG. 15 is a circuit diagram of the pipeline control signal generator circuit 331.

A signal P2ON outputted from the circuit 331 of FIG. 15 is a signal indicating that signal NBSRT goes high in an odd-numbered cycle. The signal P2ON starts control to operate the latch gates 107 shown in FIGS. 1 and 3. Operating the latch gate 107 causes the second pipeline stage S2 in the pipeline to appear, allowing the pipeline operation in the second stage to temporarily change to the pipeline in the third stage. Signal P2ON is latched at the beginning of the cycle and when the burst clock BCK in the cycle goes low, is outputted as a signal ST2. The signal ST2 is used for precharge control of LDB.

Figure 16:
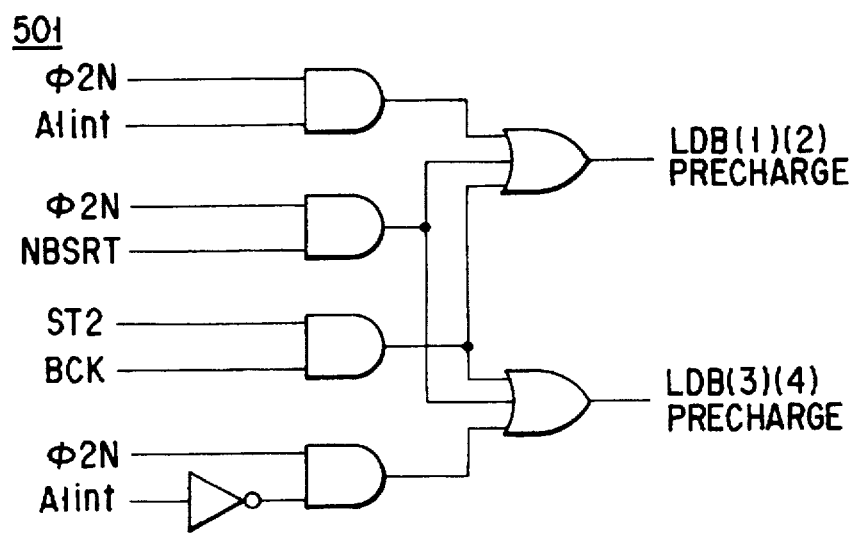
FIG. 16 is a circuit diagram of the precharge control signal generator circuit.

FIG. 16 is a circuit diagram of the LDB precharge control signal generator circuit 501.

The LDB precharge operation is carried out in each cycle in the pipeline type. In a 2-bit prefetch type, the LDB precharge operation is performed at intervals of two cycles, reducing the power consumption and making the operation margin greater. With the SDRAM of the present invention, however, because a new burst starts in an odd-numbered cycle, arrival of signal NBSRT causes the SDRAM to temporarily operate in the pipeline type, necessitating the switching of precharge control.

To make explanation easier to understand, the correspondence between LDB and address bits is shown.

FIG. 17 shows the relationship between the address buses AB1 and AB2 of FIG. 4 and LDB1, LDB2, LDB3, LDB 4 (the bracket numerals in the figure) and the low-order bits A0, A1 in serial access of FIG. 3.

When two consecutive bits of data are transferred, four bits of data are transferred simultaneously. Then, two bits of data are selected from the transferred data by the select gate 113 having a selecting function (see FIGS. 1 and 3). The relationship between the transferred four bits and the selected two bits is as follows.

The four bits constitute consecutive bits of data in burst access. Two bits selected from the four bits constitute the first and second bits or the second and third bits, depending on the order of accessing. This is because the address for selecting CSL is always used together with this address plus 1 as described in FIG. 4. By doing this, sending four bits of data at intervals of two cycles onto LDB enables burst access to be executed continuously, starting at a given address. The precharging of LDB need not be done for all of the four pairs at intervals of two cycles. The gate 11 having a selecting function precharges the selected two pairs that have finished data transfer. The pairs are LDB1 and LDB2 or LDB3 and LDB4. These pairs are selected by the column select signal CSL simultaneously.

As shown in FIG. 16, if the starting address of the burst access is not set again in the course of LDB precharging, precharging will be done to LDB1 and LDB2 or LDB3 and LDB4 to which the new data is transferred according to the internal address A1int of the access each time an even-numbered cycle arrives. If the starting address of the burst access is set again in an even-numbered cycle, precharging will be effected to all of the four pairs, LDB1, LDB2, LDB3, and LDB4, in the cycle, it falls on a precharge cycle. This is because totally new four bits are transferred to the LDB. When the starting address of the burst access is set in an odd-numbered cycle, even if the number of pipeline stages increases temporarily, precharging forced to be done would destroy the selected data. To prevent this, in a cycle next to the cycle in which resetting has been done, LDB1, LDB2, LDB3, and LDB4 are all precharged. The signal ST2 produced at the circuit of FIG. 15 controls the precharging. When signal ST2 is at a high level, precharging is effected in a cycle in which the burst clock BCK goes high.

Figure 19:
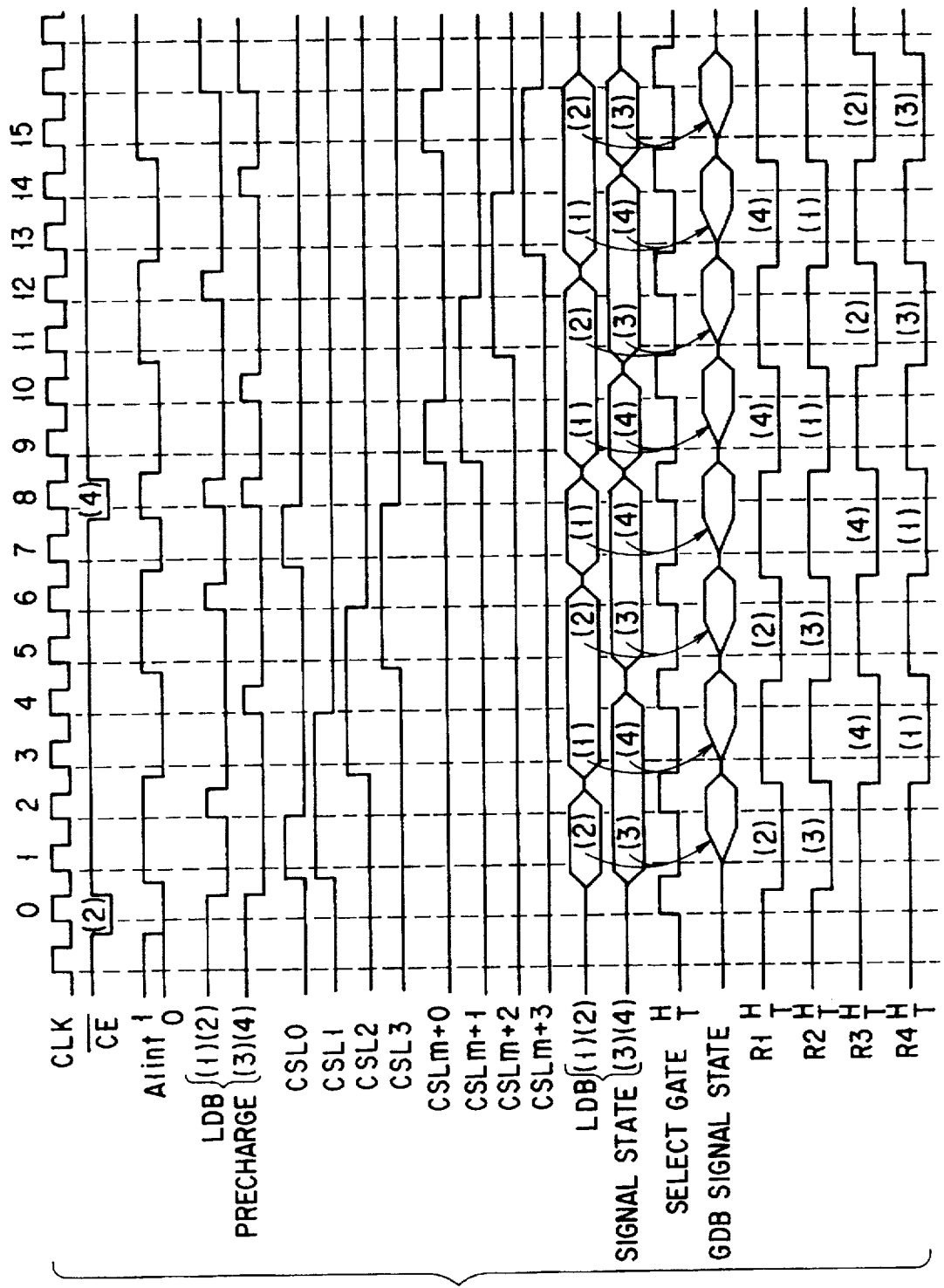
FIG. 19 is an operating waveform diagram of the SDRAM.
Figure 20:
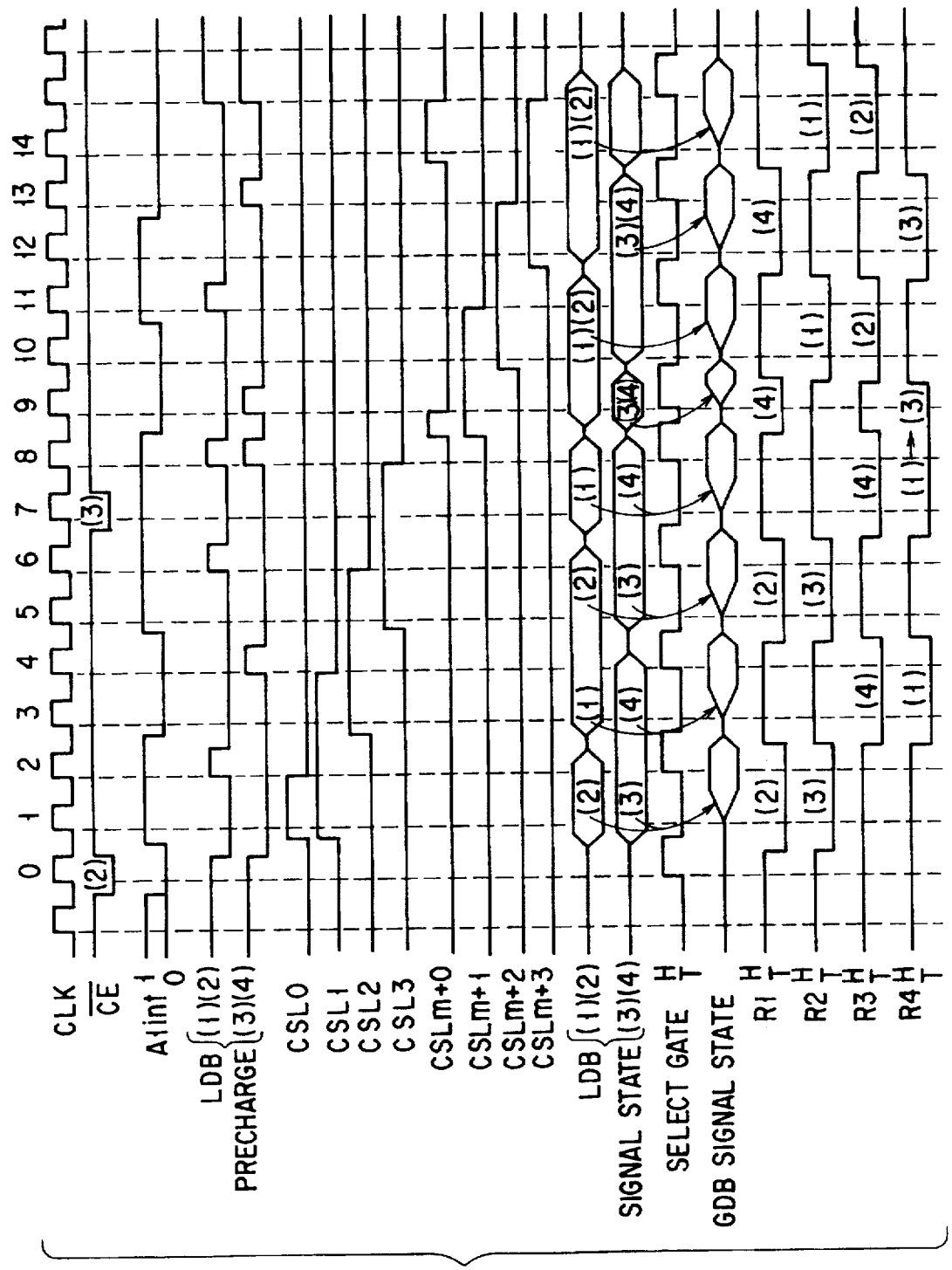
FIG. 20 is an operating waveform diagram of the SDRAM.

FIGS. 19 and 20 are operating waveform diagrams of the SDRAM.

In both FIG. 19 and FIG. 20, the data length in burst data access is assumed to be 8. In the external clock CLK, the portions marked with numerals correspond to burst clock BCK. A signal /CE is a command signal for specifying a new beginning cycle of burst access. At the rising of the burst clock BCK in a cycle containing the command signal, the starting address of the burst access is taken in. The number of LDB on which the data from the address set by the command is to appear is shown together with the waveform of signal /CE. The selection relationship between the column select lines CSL and LDB is as shown in FIG. 18. For instance, if column select line CSL0 has been selected, LDB1 and LDB2 will be selected and the data will be transferred to the selected LDB1 and LDB2.

FIG. 19 shows the operating waveforms at the time when a new burst is started in an even-numbered cycle. More specifically, an address has been set so that the data appeared on LDB4 may be at the beginning of the eighth cycle.

As shown in FIG. 19, after the address setting by a command (see the waveform of /CE), internal address bit A1int changes from "1" to "0."

In the first burst, the data on LDB2 is at the beginning. Therefore, LDB1, LDB2, LDB3, and LDB4 in a precharged state are stopped from being precharged, which allows CSL0 and CSL1 to go high, supplying the data. Then, when select gate 113 goes into a through state, which enables LDB2 and LDB3 to be connected to GDB, allowing the data to be transferred. The transferred data is stored in output register R1 and output register R2 that are in a through state.

From the second cycle on, CSL2 goes high, allowing the new data to be transferred only to LDB1 and LDB2. Therefore, precharging is done at the beginning of the cycle. At this time, select gate 113 goes into a hold state, separating LDB2 from GDB to be precharged. In the mean time, output registers R1 and R2 go into a hold state high and output registers R3 and R4 go into a through state. When select gate 113 then goes into a through state, which causes LDB4 and LDB1 to be connected to GDB, allowing the data to appear on GDB. The data is then stored in the output register.

From the fourth cycle on, CSL3 goes high, which enables the data to be transferred only to LDB3 and LDB4 and the same operations are going on.

When a new burst has been set in the eighth cycle, the new data will appear on all of LDB1 to LDB4. Therefore, LDB1 to LDB4 are all precharged at the beginning of the eighth cycle. CLSm+0 and CSLm+1 go high, which allows the data to appear on LDB. Select gate 113 connects LDB4 and LDB1 to GDB, thereby transferring the data. The data transfer continues as described above.

The second burst is almost the same as the first burst except for only the selection of select gate 113 and the state of the data stored in the output register. Because a new burst is not set in the course of the second burst, the burst clock signal BCK stops after eight cycles and the data accessing stops at the fifteenth cycle.

FIG. 20 shows the operating waveforms at the time when a new burst is started in an odd-numbered cycle. More specifically, a new burst has been set in the seventh cycle.

In this case, the operation proceeds as shown in FIG. 19 until the start of a new burst has been set in the seventh cycle. Because the new setting in the seventh cycle is done in an odd-numbered cycle, LDB1 to LDB4 are all precharged in the eighth cycle as explained in FIG. 16. The address latched in the seventh cycle raises CSLm+0 and CSLm+1 in the eighth cycle, because the pipeline operation in the second stage S2 is carried out temporarily. In the seventh cycle, the data items on LDB4 and LDB1 in the preceding burst are stored in output register R3 and output register R4. Only the data on LDB4 in output register R3 is outputted. The data on LDB1 in output register R4 is replaced with the data on LDB3 on the starting address of a new burst as a result of the switching at the select gate 113 and transfer of the new data to LDB in the eighth cycle. As explained in FIGS. 5A and 5B, from the eighth cycle on, the division of data storage in the register is changed. From the ninth cycle on, the original operation of the burst access having the seventh cycle at the beginning is carried out, the burst clock signal BCK is stopped in the fourteenth cycle in which the burst of the eighth cycle ends, and the data accessing is stopped in the fourteenth cycle.

The output register control circuit 401 for changing the division of the output register associated with FIGS. 5A and 5B in the eighth cycle will be described.

Figure 21:
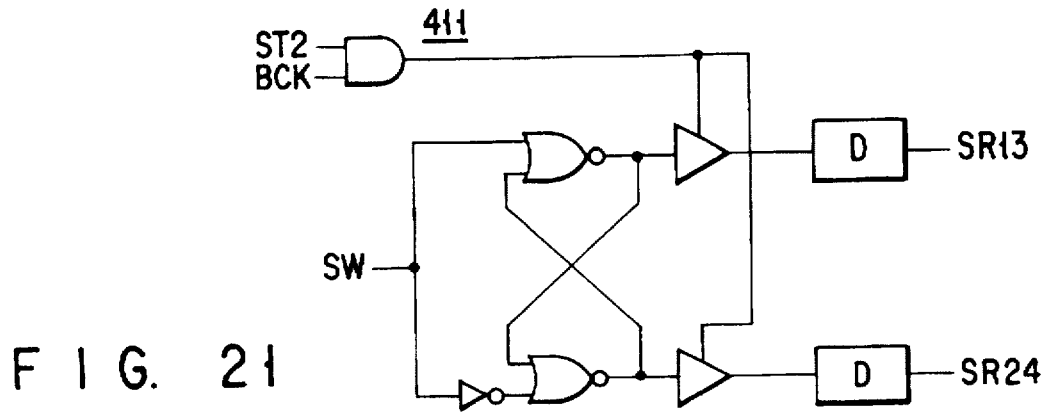
FIG. 21 is a circuit diagram of the division changing signal switching circuit.

FIG. 21 is a circuit diagram of the division changing signal switching circuit 411.

In the initial state of the circuit 411 of FIG. 21, signal SR13 is at a high level. Signal SW is outputted from the circuit 341 of FIG. 12 and changes from a low level to a high level by the setting in the first odd-numbered cycle. Thereafter, it alternates between the low level and the high level. When signal SW goes low, high, and low in that order, signal SR13 goes high, low, and high in that order and signal SR24 goes low, high, and low in that order. The state changes after a certain period of time has elapsed since the cycle next to the cycle in which the level of signal SW changed. This is because the signal latched by the logical product (AND) of (signal ST2 and) burst clock BCK are outputted via a delay circuit D as signal SR13 and signal SR24, respectively. Such timing is set to synchronize the data transfer with the switching of the output register.

Figure 22:
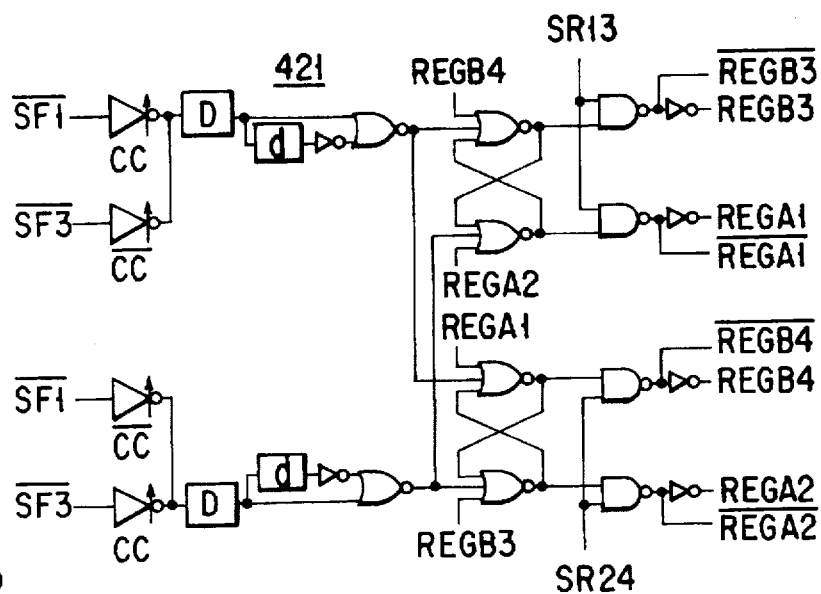
FIG. 22 is a circuit diagram of the division signal generator circuit.

FIG. 22 is a circuit diagram of the division signal generator circuit 421.

As shown in FIG. 22, signal /SF1 and signal /SF3 are the outputs of the shift register 201 of FIG. 9 and signal CC and signal /CC are the signals outputted from the circuit 341 of FIG. 12. When the level of signal CC changes, this causes signal /SF1 to change roles with signal /SF3. This is because the order in which the data is stored in the divisions must be changed as the division of the output register is changed, which will be explained later. Signal SR13 and signal SR24 are the signals corresponding to the way in which the register is divided. When signal SR13 and signal SR24 are caused to correspond to the division of the output register of FIGS. 5A and 5B, signal SR13 corresponds to a combination of output register R1 and output register R2 and a combination of output register R3 and output register R4, and signal SR24 corresponds to a combination of output register R2 and output register R3 and a combination of output register R4 and output register R1. The reason why the output signals REGB4, REGA2, REGA1, and REGB3 of the circuit of FIG. 22 are inputted to a flip-flop composed of NOR circuits is that, when the division of the output register is changed, the initial setting is done to open the gates to the divisions in which the data should be stored. In the figure, the symbols D and d indicate delay circuits for producing a suitable delay.

Figure 23:
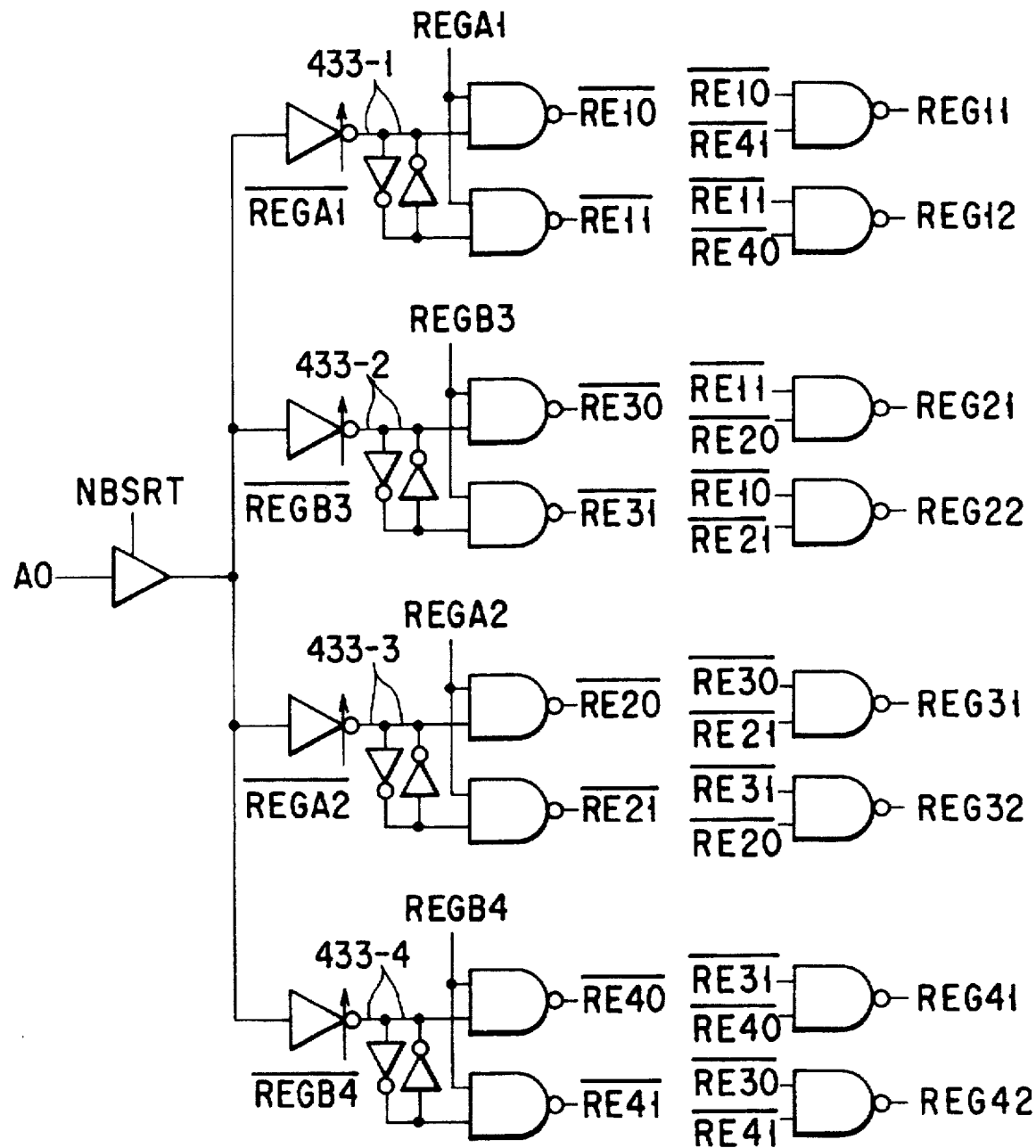
FIG. 23 is a circuit diagram of the register select signal generator circuit.

FIG. 23 is a circuit diagram of the register select signal generator circuit 431.

One of GDB1 and GDB2 in FIG. 3 corresponds to the lowest-order bit A0 of "0" of the address and the other corresponds to the lowest-order bit A0 of "1." They also correspond to GDB1 and GDB2 of FIG. 6. In a cycle specifying the beginning of the burst, the lowest-order bit A0 of the address is stored in any of the four latch sections 433-1, 433-2, 433-3, and 433-4 that output signals for controlling the division of an output register that is out of operation at that time. Specifically, if the data is to be stored in REGA1 section of FIGS. 5A and 5B, the lowest-order A0 will not be transferred to the latch section 433-1 of FIG. 23 opened and closed by signal /REGA1, because signal /REGA1 is at a low level, but be transferred to the other latch sections 433-2, 433-3, 433-4. Depending on the value of the lowest-order bit A0, any one of signal /RE10 to signal /RE41 goes low at the beginning of the new burst according to the division of the register in which the data is stored. This causes the two corresponding transfer gate signals to go high. For instance, if /RE30 goes low, signals REG31 and REG42 will go high, causing the data on GDB1 to be stored in output register R3 and the data on GDB2 to be stored in output register R4.

Figure 24:
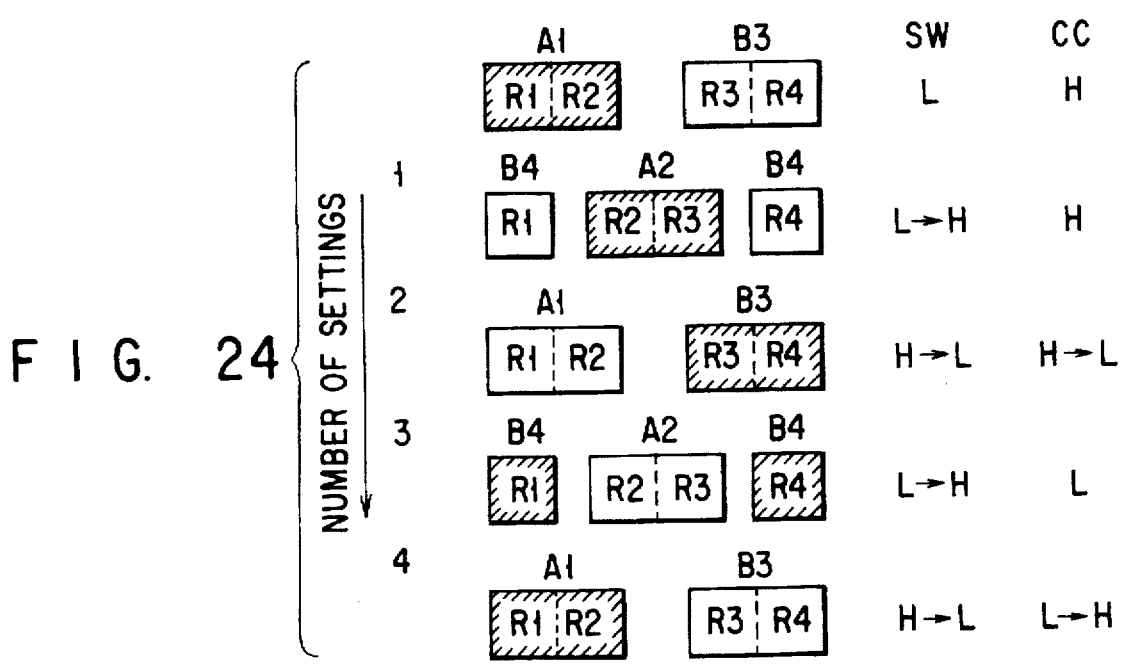
FIG. 24 shows the correspondence between the levels of signal SW and signal CC and the output registers R1 to R4.

FIG. 24 illustrates the change of the output register division at the time when a new burst has been set. It also shows how signal SW and signal CC outputted from the circuit 341 of FIG. 12 change. The top row in the figure illustrates the original register division. It is assumed that in the burst access, the first odd-numbered setting is done. The individual signals remain in the initial state; signal SW is at a low level and signal CC is at a high level, until the first setting is done.

There are two ways of dividing the output register as shown in FIG. 24. The divided blocks are indicated by A1, B3, A2, and B4 as shown in FIG. 24. The divisions A1, B3 alternate with the divisions A2, B4. The order in which the data is stored is such that the block in which the data is stored moves between the hatched divided blocks and between the non-hatched divided blocks. Specifically, if new setting is done while A1 is storing the data, A2 will store the data next. If setting is done while A2 is storing the data, B3 will store the data next. Signal SW changes the state each time setting is done in an odd-numbered cycle. To achieve the transfer sequence as shown in the figure, a signal that changes at intervals of two cycles is needed. Such a signal is signal CC. In the absence of control by such a signal, the division in the top row keeps alternating with the division just below and cannot advance the sequence. Specifically, in the circuit of FIG. 22, when signal CC changes, signal /SF1 replaces roles with signal /SF3, leading the signal for controlling the transfer gate in phase with respect to the shift register of FIG. 7.

Figure 25:
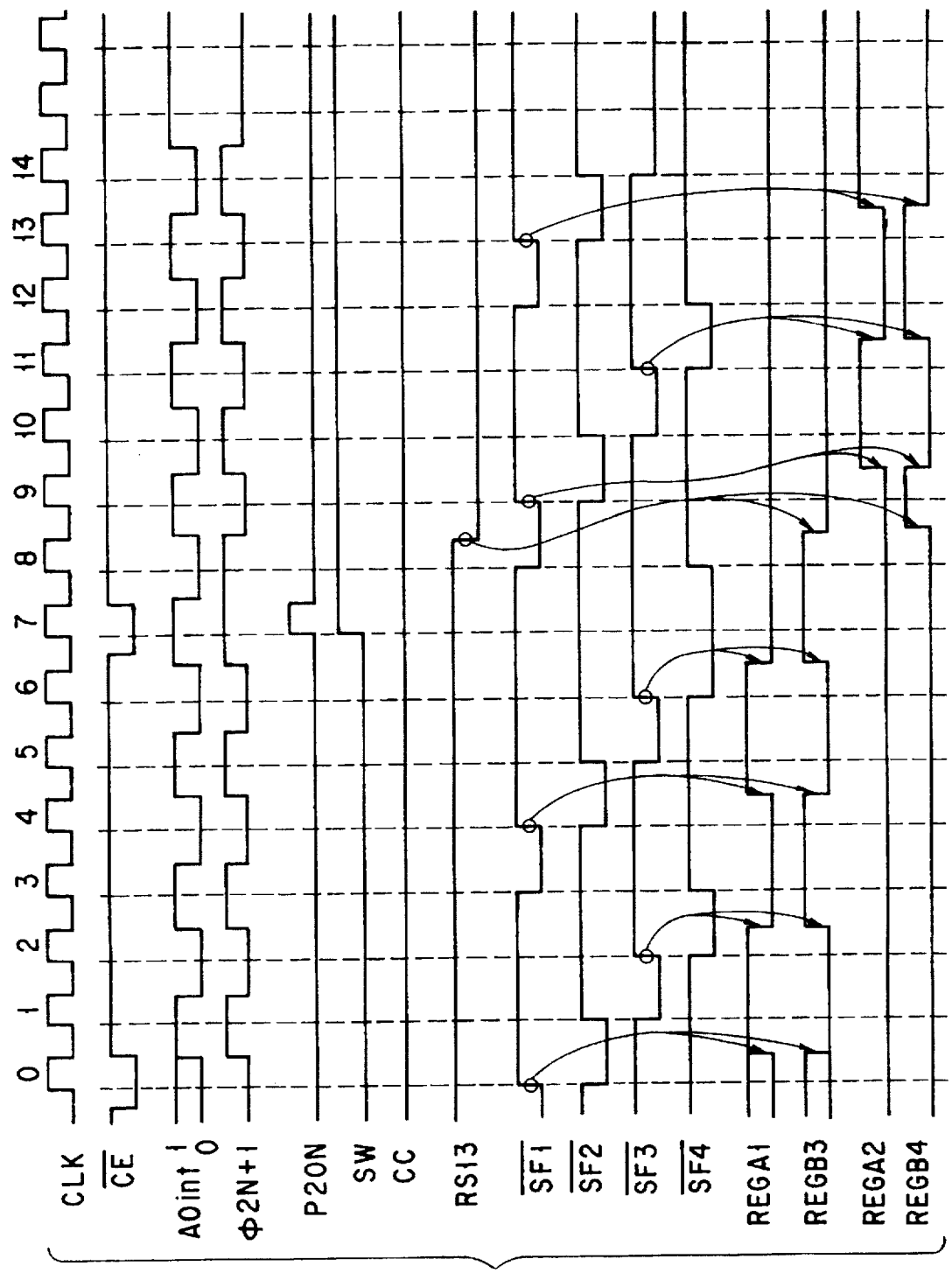
FIG. 25 is an operating waveform diagram of the circuitry around the output register.

FIGS. 25 and 26 show operating waveforms to help explain control of the output register. These operating waveforms correspond to FIG. 20 where the data transfer state is shown.

As shown in FIG. 25, when a burst starts in the 0-th cycle, the shift register with signal /SF1 being initially set at a low level starts to operate. When the signal ø2N+1 generated by the circuit shown in FIG. 13 or FIG. 14 changes as shown in FIG. 25, this specifies an odd-numbered cycle. Signal /SF1 goes high, placing signal REGA1 at a high level and signal REGB3 at a low level. Signal /SF3 goes high, placing signal REGA1 at a low level and signal REGB3 at a high level. When the data is stored in one divided block to another in the output register and a new burst is set in an odd-numbered cycle 7, signal P2ON and signal ST2 from the circuit of FIG. 15 and signal SW from the circuit of FIG. 12 change. When in the eighth cycle, signal SR13 from the circuit of FIG. 21 goes low and signal SR24 goes high, the signal for controlling B3A1 division in the circuit of FIG. 22 is changed to the signal for controlling B4A2 division. The feedback of signal REGB3 to the NOR circuit enables signal REGB4 to rise swiftly. Next, the rising of /SF1 causes signal REGB4 to go low and signal REGA2 to go high. Thereafter, changing is effected by signal /SF3. This corresponds to the state change at the time when the number of settings is one in FIG. 22 and to the operation of storing the data by B4 and A2. After the burst has been completed in the fourteenth cycle, the individual signals remain in the last states, preparing for the next burst. FIG. 26 illustrates operating waveforms at the time when another burst has been set after that.

In FIG. 26, it is assumed that a new burst starts in the 0-th cycle after a short time has elapsed since the preceding burst. When signal /SF3 goes high, which starts a burst, causing signal REGA2 to go low and signal REGB4 to go high. Differently from FIG. 25, the divided blocks A2B4 store the data. When a new burst has been set in the seventh cycle, signal SW goes low and signal CC goes low. When in the eighth cycle, signal SR13 from the circuit of FIG. 21 goes high and signal SR24 goes low, the signal for controlling B4A2 division in the circuit of FIG. 22 is changed to the signal for controlling B3A1 division. The feedback of signal REGB2 to the NOR circuit enables signal REGB3 to rise swiftly. Next, as a result of the rising of /SF3, signal CC is at a low level, which causes signal /SF1 to replace roles with signal /SF3 in the circuit of FIG. 22. This causes signal REGB3 to go low and signal REGA1 to go high. Thereafter, changing is effected by signal /SF1. This corresponds to the state change at the time when the number of settings is 2 in FIG. 24 and to the operation of storing the data by signals B3 and A1.

As described so far, with the present invention, it is possible to provide a synchronous semiconductor memory device that, although having an output register for serial data output, is capable of guiding an address to a data transfer path even in cycles other than the limited cycles and consumes less electric power. It is also possible to provide a synchronous semiconductor memory device that is capable of serially outputting the data continuously from the output register, even an address is directed to a data transfer path in cycles other than the limited cycles. It is further possible to provide a synchronous semiconductor memory device that, although having flexibility in changing the access address, is capable of increasing the efficiency of data transfer and consumes less electric power. It is still further possible to provide a method of operating a synchronous semiconductor memory device that is capable of directing an address to a data transfer path even in cycles other than the limited cycles.

Data transfer effected by an SDRAM associated with an embodiment of the present invention can be applied to data transfer within a computer or data transfer between network computers. In this case, the sections that process data, including the address decoder, memory cell array, and sense amplifier, have only to be replaced with the data processing section in the computer or the network computers.

FIG. 27 is a block diagram showing the SDRAM of FIG. 1 in greater detail.

FIG. 28 is a block diagram of a data-processing system which incorporates the data-transfer system provided in the SDRAM according to the embodiment of the present invention.

FIG. 29 is a block diagram of a network computer system which incorporates the data-transfer system provided in the SDRAM according to the embodiment of the present invention.

FIG. 30 is a diagram illustrating a condition in which data is transferred in the SDRAM shown in FIG. 27.

FIG. 31 is a diagram showing another condition in which data is transferred in the SDRAM shown in FIG. 27.

As shown in FIG. 30, two data items 1 and 2 are transferred to a stage 1 in the cycle "0". The data items 1 and 2 are column address signals, both corresponding to the starting address of burst access. In the cycle "2", two new data items 3 and 4 are transferred to a stage 1. These data items 3 and 4 are column address signals, both corresponding to the address (updated address) which is input after the starting address. Thus, the stage 1 and the stage 2 are connected to each other when two new data items are transferred in any limited cycle (i.e., cycle 2, cycle 4, . . . ), that is, when a number of new data items are transferred in limited cycles a, 2a, . . . .

FIG. 31 illustrates a condition in which two data items are transferred in cycles other than the limited cycles, i.e., cycle 1, cycle 3, . . . . As shown in FIG. 31, two data items 1 and 2 are transferred to the stage 1 in the cycle "0". The data items 1 and 2 are column address signals, both corresponding to the starting address of burst access. In the cycle "1", two new data items 3 and 4 are transferred to the stage 1. The data items 3 and 4 are column address signals, both corresponding to the address (updated address) which is input after the starting address. Thus, the stage 1 and the stage 2 are disconnected from each other when two new data items are transferred in any cycle other than the limited ones (i.e., cycle 1, cycle 3, . . . ), that is, when a number of new data items are transferred in a cycle which corresponds to "mod 2a (modulus 2a)."

This data transfer system can be used to transfer data in the data processing system shown in FIG. 28 or in the network computer system illustrated in FIG. 29.

With the SDRAM of the embodiment, the number of pipeline stages is changed according to the timing with which the change of operating cycle is required, such as address changes. The number of pipeline stages, however, may not be changed in some use.

For instance, when the frequency of the system clock is low, the timing with which a starting address for new burst data access is inputted is not limited in the course of burst data accessing, enabling the starting address to be inputted at any time. Namely, stages S1, S2, S3 are used in a separated state at all times.

In contrast, when the frequency of said system clock is high, the timing with which a starting address for new burst data access is inputted is limited in the course of burst data accessing. The starting address is inputted only during the limited timing. Namely, of stages S1, S2, S3, stage S1, S2 are always used in a through state.

Whether the number of pipeline stages is changed can be determined by the specification of a system in which an SDRAM of the invention is built.

For instance, with a system that always requires address change in a cycle corresponding to an a cycle, stages S1, S2 are always connected through and consequently the number of pipeline stages in the SDRAM is not changed.

In contrast, with a system that requires address change also in a cycle other than a cycle corresponding to an a cycle, stages S1, S2, S3 are separated from each other when address change is required in a cycle other than a cycle corresponding to an a cycle, whereas stages S1, S2 are connected through when address change is required in a cycle corresponding to an a cycle.

As described above, the SDRAM of the embodiment can cope with various system suitably.

Furthermore, when data transfer implemented by the SDRAM of the embodiment is applied to data transfer within a computer or data transfer between network computers, this enables a data transfer system capable of transferring a larger volume of data at higher speed to be constructed in the field of computer or network computer.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A data transfer system for transferring data in synchronization with a clock, comprising:

a data transfer path that is capable of transferring an a number of data items in parallel simultaneously and that includes pipeline division sections, which can be divided into an N number of pipeline stages, each of the N divided pipeline stages temporarily holding data; and a control section for controlling said pipeline stage division sections, wherein said control section connects (n−1) divisions (n=a/m: m is the number of cycles necessary for data transfer between said divided pipeline stages adjacent to each other) out of n (=N−1) of said pipeline division sections, not separating all of said N pipeline stages from each other, when the transfer of the a number of data items is started in a cycle corresponding to an a cycle, and activates all of said n pipeline division sections, separating all of said N pipeline stages from each other, when the transfer of the a number of data items is started in a cycle different from the a cycle.

2. A data transfer system for transferring data in synchronization with a clock, comprising:

a data transfer path capable of transferring an a number of data items in parallel simultaneously;

a k number of registers (the k number of registers are assigned numbers ranging from 0 to (k−1), respectively, in the order of data transfer) connected to said data transfer path;

a first control section for controlling data transfer from said data transfer path to said registers in such a manner that when the transfer of the a number of data items is started in a cycle corresponding to an a cycle, the first control section causes the a number of data items to be transferred to a group of the register 0 to register (a−1) and a group of register a to register (2a−1) alternately every the a cycle, and when the transfer of the a number of data items is started in a cycle corresponding to an i(mod 2a) cycle away from the a cycle, the first control section recombines said registers and causes the a number of data items to be transferred to a group of register i(mod 2a) to register (i+a−1(mod 2a)) and a group of register (i+a(mod 2a)) to register (i+2a−1(mod 2a)) alternately every the a cycle; and a second control section for controlling data transfer from said registers in such a manner that it transfers data items serially in synchronization with said clock in the order that said registers have been numbered (provided that control returns to register 0 after register (k−1)).

3. A data transfer system for transferring data in synchronization with a clock, comprising:

a data transfer path that is capable of transferring an a number of data items in parallel simultaneously and that includes pipeline division sections, which can be divided into an N number of pipeline stages, each of the N divided pipeline stages temporarily holding data;

a k number of registers (the k number of registers are assigned numbers ranging from 0 to (k−1), respectively, in the order of data transfer) connected to said data transfer path;

a first control section for controlling said pipeline stage division sections, wherein said first control section connects (n−1) divisions (n=a/m: m is the number of cycles necessary for data transfer between said divided pipeline stages adjacent to each other) out of n (=N−1) of said pipeline division sections, not separating all of said N pipeline stages from each other, when the transfer of the a number of data items is started in a cycle corresponding to an a cycle, and activates all of said n pipeline division sections, separating all of said N pipeline stages from each other, when the transfer of the a number of data items is started in a cycle corresponding to an i(mod 2a) cycle different from the a cycle;

a second control section for controlling data transfer from said data transfer path to said registers in such a manner that when the transfer of the a number of data items is started in the cycle corresponding to the a cycle, the second control section causes the a number of data items to be transferred to a group of register 0 to register (a−1) and a group of register a to register (2a−1) alternately every the a cycle, and when the transfer of the a number of data items is started in the cycle corresponding to the i(mod 2a) cycle different from the a cycle, the second control section recombines said registers and causes the a number of data items to be transferred to a group of register i(mod 2a) to register (i+a−1(mod 2a)) and a group of register (i+a(mod 2a)) to register (i+2a−1 (mod 2a)) alternately every the a cycle; and a third control section for controlling data transfer from said registers in such a manner that it transfers data items serially in synchronization with said clock in the order that said registers have been numbered (provided that control returns to register 0 after register (k−1)).

4. A data transfer system for transferring data in units of a number of data items in synchronization with a clock, comprising:

a data transfer path that transfers the a number of data items in parallel and outputs data a times as fast as the speed of the parallel data transfer in such a manner that it transfers the a number of data items using an a cycle of the clock and outputs the a number of transferred data items at a rate of one data item per cycle of the clock and that includes pipeline division sections, which can be divided into an N number of pipeline stages, each of the N divided pipeline stages temporarily holding data; and a control section for controlling said pipeline stage division sections, wherein said control section connects (n−1) divisions (n=a/m: m is the number of cycles necessary for data transfer between said divided pipeline stages adjacent to each other) out of n (=N−1) of said pipeline division sections, not separating all of said N pipeline stages from each other, when the transfer of the a number of data items is started in a cycle corresponding to the a cycle, and activates all of said n pipeline division sections, separating all of said N pipeline stages from each other, when the transfer of the a number of data items is started in a cycle different from the a cycle.

5. A data transfer system for transferring data in units of a number of data items in synchronization with a clock, comprising:

a data transfer path that transfers the a number of data items in parallel and outputs data a times as fast as the speed of the parallel data transfer in such a manner that it transfers said a number of data items using an a cycle of the clock and outputs the a number of transferred data items at a rate of one data item per cycle of the clock;

a k number of registers (the k number of registers are assigned numbers ranging from 0 to (k−1), respectively, in the order of data transfer) connected to said data transfer path;

a first control section for controlling data transfer from said data transfer path to said register in such a manner that when the transfer of the a number of data items is started in a cycle corresponding to the a cycle, the first control section causes the a number of data items to be transferred to a group of register 0 to register (a−1) and a group of register a to register (2a−1) alternately every a cycle, and when the transfer of the a number of data items is started in a cycle corresponding to an i(mod 2a) cycle away from the a cycle, the first control section recombines said registers and causes the a number of data items to be transferred to a group of register i(mod 2a) to register (i+a−1(mod 2a)) and a group of register (i+a(mod 2a)) to register (i+2a−1(mod 2a)) alternately every the a cycle; and a second control section for controlling data transfer from said registers in such a manner that it transfers data items serially in synchronization with the clock in the order that said registers have been numbered (provided that control returns to register 0 after register (k−1)).

6. A data transfer system for transferring data in units of a number of data items in synchronization with a clock, comprising:

a data transfer path that transfers the a number of data items in parallel and outputs data a times as fast as the speed of the parallel data transfer in such a manner that it transfers the a number of data items using an a cycle of the clock and outputs the a number of transferred data items at a rate of one data item per cycle of the clock, and that includes pipeline division sections, which can be divided into an N number of pipeline stages, each of the N divided pipeline stages temporarily holding data;

a k number of registers (the k number of registers are assigned numbers ranging from 0 to (k−1), respectively, in the order of data transfer) connected to said data transfer path;

a first control section for controlling said pipeline stage division sections, wherein said first control section connects (n−1) divisions (n=a/m: m is the number of cycles necessary for data transfer between said divided pipeline stages adjacent to each other) out of n (=N−1) of said pipeline division sections, not separating all of said N pipeline stages from each other, when the transfer of the a number of data items is started in a cycle corresponding to the a cycle, and activates all of said n pipeline division sections, separating all of said N pipeline stages from each other, when the transfer of the a number of data items is started in a cycle corresponding to an i(mod 2a) cycle different from the a cycle;

a second control section for controlling data transfer from said data transfer path to said register in such a manner that when the transfer of the a number of data items is started in the cycle corresponding to the a cycle, the second control section causes the a number of data items to be transferred to a group of register 0 to register (a−1) and a group of register a to register (2a−1) alternately every the a cycle, and when the transfer of the a number of data items is started in the cycle i(mod 2a) cycle different from the a cycle, the second control section recombines said registers and causes the a number of data items to be transferred to a group of register i(mod 2a) to register (i+a−1(mod 2a)) and a group of register (i+a(mod 2a)) to register (i+2a−1(mod 2a)) alternately every the a cycle; and a third control section for controlling data transfer from said registers in such a manner that it transfers data items serially in synchronization with the clock in the order that said registers have been numbered (provided that control returns to register 0 after register (k−1)).

7. A synchronous semiconductor memory device that serially outputs data items at least one by one every cycle of a clock, comprising:

address taking-in means for taking an address in the device;

decoding means for decoding the taken-in address;

a memory cell array composed of a plurality of memory cells for storing data;

a data bus electrically connected to said memory cells;

transfer means for transferring the one corresponding to said decoded address of the data items stored in said memory cells to said data bus;

an output register electrically connected to said data bus;

transfer means for transferring the data items transferred to said data bus to said output register in units of a data item at a time; and output means for serially outputting the a data items transferred to said output register in synchronization with said clock, wherein a signal path from said address taking-in means to said output register is divided into N pipeline stages, the data in each pipeline stage is transferred in m cycles of the clock, when data accessing is started in a cycle corresponding to a cycles of said clock, all of said N pipeline stages are not separated from each other and n (=a/m) consecutive ones of said pipeline stages are connected through with each other, and when data accessing is started in a cycle departing from the a cycles of said clock, all of said N pipeline stages are separated from each other.

8. A synchronous semiconductor memory device according to claim 7, wherein said m is one and said n is two and said N is three, said three pipeline stages are composed of a first pipeline stage ranging from the taking in of said address to the decoding, a second pipeline stage ranging until the data corresponding to said decoded address has been transferred to said data bus, and a third pipeline stage ranging until the data items transferred to said data bus has been transferred to said output register in units of a data items at a time, and the pipeline stages connected through when said data accessing is started in a cycle corresponding to the a cycles of said clock are said first pipeline stage and said second pipeline stage.

9. A synchronous semiconductor memory device that serially outputs data items at least one by one in every cycle of a clock, comprising:

address taking-in means for taking an address in the device;

decoding means for decoding the taken-in address;

a memory cell array composed of a plurality of memory cells for storing data;

a data bus electrically connected to said memory cells;

transfer means for transferring the one corresponding to said decoded address of the data items stored in said memory cells to said data bus;

output registers electrically connected to said data bus;

transfer means for transferring the data items transferred to said data bus to said output registers in units of a data items at a time; and output means for serially outputting the a data items transferred to said output registers in synchronization with said clock, wherein the number of said output registers is k and said k output registers are assigned number 0 to number k−1 in accessing order, and said output registers always output the data items cyclically in the order in which said numbers are arranged, when data accessing is started in a cycle corresponding to the a cycles of said clock, the data items transferred to said data bus are alternately transferred in units of a data items to a group of output registers No. 0 to No. a−1 and a group of output registers No. a to No. 2a−1 at regular intervals of a cycles, and when data accessing is started in a cycle departing from i(mod 2a) cycles from the cycle corresponding to the a cycles of said clock, the groups of said output registers are changed and the data items transferred to said data bus are alternately transferred in units of a data items to a group of output registers No. i(mod 2a) to No. i+a−1(mod 2a) and a group of output registers No. i+a(mod 2a) to No. i+2a−1(mod 2a) at regular intervals of a cycles.

10. A synchronous semiconductor memory device according to claim 9, wherein said k is four and said a is two.

11. A synchronous semiconductor memory device that serially outputs data items at least one by one every cycle of a clock, comprising:

address taking-in means for taking an address in the device;

decoding means for decoding the taken-in address;

a memory cell array composed of a plurality of memory cells for storing data;

a data bus electrically connected to said memory cells;

transfer means for transferring the one corresponding to said decoded address of the data items stored in said memory cells to said data bus;

output registers electrically connected to said data bus;

transfer means for transferring the data items transferred to said data bus to said output registers in units of a data items at a time; and output means for serially outputting the a data items transferred to said output registers in synchronization with said clock, wherein a signal path from said address taking-in means to said output register is divided into N pipeline stages, the data in each pipeline stage is transferred in m cycles of the clock, when data accessing is started in a cycle corresponding to a cycles of said clock, all of said N pipeline stages are not separated from each other and n (=a/m) consecutive ones of said pipeline stages are connected through with each other, when data accessing is started in a cycle departing from the a cycles of said clock, all of said N pipeline stages are separated from each other, the number of said output registers is k and said k output registers are assigned number 0 to number k−1 in accessing order, and said output registers always output the data cyclically in the order in which said numbers are arranged, when data accessing is started in a cycle corresponding to the a cycles of said clock, the data items transferred to said data bus are alternately transferred in units of a data items to a group of output registers No. 0 to No. a−1 and a group of output registers No. a to No. 2a−1 at regular intervals of a cycles, and when data accessing is started in a cycle departing from i(mod 2a) cycles from the cycle corresponding to the a cycles of said clock, the groups of said output registers are changed and the data items transferred to said data bus are alternately transferred in units of a data items to a group of output registers No. i(mod 2a) to No. i+a−1(mod 2a) and a group of output registers No. i+a(mod 2a) to No. i+2a−1(mod 2a) at regular intervals of a cycles.

12. A synchronous semiconductor memory device comprising:

an address decoder into which an address is inputted and which decodes the address and outputs a column select signal to a column select line;

a latch gate provided in said column select line;

bit lines to which a plurality of memory cells are connected and which are selected by said column select signal;

a local data bus connected to said bit lines;

a select gate that selects said local data bus and connects this bus to a global data bus;

output registers that are connected to said global data bus and serially outputs a data items by means of a cycles of a clock;

data transfer control means that receives a start signal indicating the start of a new burst in synchronization with said clock and, when receiving the start signal in a cycle other than said a cycles, closes said latch gate; and output register control means that receives a start signal indicating the start of a new burst in synchronization with said clock and, when receiving the start signal in a cycle other than said a cycles, changes the division of the combination of said output registers.

13. A synchronous semiconductor memory device comprising:

a data transfer path which can be divided into at least two pipeline stages and which is connected to a first output register group that serially outputs the data corresponding to the set address by the use of at least two cycles of a burst clock and a second output register group that serially outputs the data by the use of at least other two cycles;

sensing means for sensing that an address is reset in the course of a cycle in which either said first output register group or said second output register group outputs the data;

pipeline dividing means that divides said data transfer path into at least two pipeline stages in response to a sense instruction from said sensing means and takes said reset address in said divided pipeline stages without waiting for the starting clock of a cycle in which the data in either said first output register group or said second output register group is outputted;

division changing means that replaces part of said first output register group with part of said second output register group in response to a sense instruction from said sensing means and thereby produces a new first output register group and a new second output register group; and output means that serially outputs the data corresponding to said reset address from either said new first output register group or said new second output register group by the use of at least two cycles of said burst clock in synchronization with the beginning clock of a cycle in which the data in either said new first output register group or said new second output register group is outputted.

14. A method of operating a synchronous semiconductor memory device which has a first pipeline stage ranging from the input of an address to the decoding of the inputted address, a second pipeline stage ranging until the data corresponding to the decoded address has been read onto a data line, a third pipeline stage ranging until the data read onto the data line has been outputted serially, and performs an internal process of the signals in said first and second pipeline stages by the use of a cycles of said clock, wherein when data accessing is effected in a cycle corresponding to a cycles of said clock, said first pipeline stage and said second pipeline stage are brought into a through state, and when the accessing of new data is effected in a cycle departing from the a cycles of said clock, said first pipeline stage is separated from said second pipeline stage, and an internal process of the signal corresponding to the data accessing before the accessing of the new data is performed in said second pipeline stage and said third pipeline stage, while an internal process of the signal corresponding to the accessing of the new data is being performed in said first pipeline stage.

15. A synchronous memory device comprising:

a data transfer path that is capable of transferring an a number of data items in parallel simultaneously and that includes pipeline division sections, which can be divided into an N number of pipeline stages, each of the N divided pipeline stages temporarily holding data said data transfer path provided at between address input and data output; and a control section for controlling said pipeline stage division sections, wherein said control section connects (n−1) divisions (n=a/m: m is the number of cycles necessary for data transfer between said divided pipeline stages adjacent to each other) out of n (=N−1) of said pipeline division sections, not separating all of said N pipeline stages from each other, when the transfer of the a number of data items is started in a cycle corresponding to an a cycle, and activates all of said n pipeline division sections, separating all of said N pipeline stages from each other, when the transfer of the a number of data items is started in a cycle different from the a cycle.

16. A synchronous memory device comprising:

a data transfer path capable of transferring an a number of data items in parallel simultaneously said data transfer path provided at between address input and data output;

a k number of registers (the k number of registers are assigned numbers ranging from 0 to (k−1), respectively, in the order of data transfer) connected to said data transfer path;

a first control section for controlling data transfer from said data transfer path to said registers in such a manner that when the transfer of the a number of data items is started in a cycle corresponding to an a cycle, the first control section causes the a number of data items to be transferred to a group of the register 0 to register (a−1) and a group of register a to register (2a−1) alternately every the a cycle, and when the transfer of the a number of data items is started in a cycle corresponding to an i(mod 2a) cycle away from the a cycle, the first control section recombines said registers and causes the a number of data items to be transferred to a group of register i(mod 2a) to register (i+a−1(mod 2a)) and a group of register (i+a(mod 2a)) to register (i+2a−1(mod 2a)) alternately every the a cycle; and a second control section for controlling data transfer from said registers in such a manner that it transfers data items serially in synchronization with said clock in the order that said registers have been numbered (provided that control returns to register 0 after register (k−1)).

17. A synchronous memory device comprising:

a data transfer path that is capable of transferring an a number of data items in parallel simultaneously and that includes pipeline division sections, which can be divided into an N number of pipeline stages, each of the N divided pipeline stages temporarily holding data said data transfer path provided at between address input and data output;

a k number of registers (the k number of registers are assigned numbers ranging from 0 to (k−1), respectively, in the order of data transfer) connected to said data transfer path;

a first control section for controlling said pipeline stage division sections, wherein said first control section connects (n−1) divisions (n=a/m: m is the number of cycles necessary for data transfer between said divided pipeline stages adjacent to each other) out of n (=N−1) of said pipeline division sections, not separating all of said N pipeline stages from each other, when the transfer of the a number of data items is started in a cycle corresponding to an a cycle, and activates all of said n pipeline division sections, separating all of said N pipeline stages from each other, when the transfer of the a number of data items is started in a cycle corresponding to an i(mod 2a) cycle different from the a cycle;

a second control section for controlling data transfer from said data transfer path to said registers in such a manner that when the transfer of the a number of data items is started in the cycle corresponding to the a cycle, the second control section causes the a number of data items to be transferred to a group of register 0 to register (a−1) and a group of register a to register (2a−1) alternately every the a cycle, and when the transfer of the a number of data items is started in the cycle corresponding to the i(mod 2a) cycle different from the a cycle, the second control section recombines said registers and causes the a number of data items to be transferred to a group of register i(mod 2a) to register (i+a−1(mod 2a)) and a group of register (i+a(mod 2a)) to register (i+2a−1 (mod 2a)) alternately every the a cycle; and a third control section for controlling data transfer from said registers in such a manner that it transfers data items serially in synchronization with said clock in the order that said registers have been numbered (provided that control returns to register 0 after register (k−1)).

18. A synchronous memory device comprising:

a data transfer path for transferring data said data transfer path provided at between address input and data output;

a register that converts parallel data transfer into serial data transfer and is provided in said data transfer path;

a dividing section for dividing said data transfer path into a plurality of pipeline stages, when data has been transferred in a cycle other than the cycle in which data transfer to said register is limited;

an input section that inputs the data transferred in the cycle other than the cycle in which data transfer to said register is limited, to at least the first stage of said divided pipeline stages; and an output section that outputs data serially from said register in a cycle other than the cycle in which data transfer to said register is limited.

19. A synchronous memory device comprising:

a data transfer path that transfers the a number of data items in parallel and outputs data a times as fast as the speed of the parallel data transfer in such a manner that it transfers the a number of data items using an a cycle of the clock and outputs the a number of transferred data items at a rate of one data item per cycle of the clock and that includes pipeline division sections, which can be divided into an N number of pipeline stages, each of the N divided pipeline stages temporarily holding data said data transfer path provided at between address input and data output; and a control section for controlling said pipeline stage division sections, wherein said control section connects (n−1) divisions (n=a/m: m is the number of cycles necessary for data transfer between said divided pipeline stages adjacent to each other) out of n (=N−1) of said pipeline division sections, not separating all of said N pipeline stages from each other, when the transfer of the a number of data items is started in a cycle corresponding to the a cycle, and activates all of said n pipeline division sections, separating all of said N pipeline stages from each other, when the transfer of the a number of data items is started in a cycle different from the a cycle.

20. A synchronous memory device comprising:

a data transfer path that transfers the a number of data items in parallel and outputs data a times, as fast as the speed of the parallel data transfer in such a manner that it transfers said a number of data items using an a cycle of the clock and outputs the a number of transferred data items at a rate of one data item per cycle of the clock said data transfer path provided at between address input and data output;

a k number of registers (the k number of registers are assigned numbers ranging from 0 to (k−1), respectively, in the order of data transfer) connected to said data transfer path;

a first control section for controlling data transfer from said data transfer path to said register in such a manner that when the transfer of the a number of data items is started in a cycle corresponding to the a cycle, the first control section causes the a number of data items to be transferred to a group of register 0 to register (a−1) and a group of register a to register (2a−1) alternately every a cycle, and when the transfer of the a number of data items is started in a cycle corresponding to an i(mod 2a) cycle away from the a cycle, the first control section recombines said registers and causes the a number of data items to be transferred to a group of register i(mod 2a) to register (i+a−1(mod 2a)) and a group of register (i+a(mod 2a)) to register (i+2a−1(mod 2a)) alternately every the a cycle; and a second control section for controlling data transfer from said registers in such a manner that it transfers data items serially in synchronization with the clock in the order that said registers have been numbered (provided that control returns to register 0 after register (k−1)).

21. A synchronous memory device comprising:

a data transfer path that transfers the a number of data items in parallel and outputs data a times as fast as the speed of the parallel data transfer in such a manner that it transfers the a number of data items using an a cycle of the clock and outputs the a number of transferred data items at a rate of one data item per cycle of the clock, and that includes pipeline division sections, which can be divided into an N number of pipeline stages, each of the N divided pipeline stages temporarily holding data said data transfer path provided at between address input and data output;

a k number of registers (the k number of registers are assigned numbers ranging from 0 to (k−1), respectively, in the order of data transfer) connected to said data transfer path;

a first control section for controlling said pipeline stage division sections, wherein said first control section connects (n−1) divisions (n=a/ m: m is the number of cycles necessary for data transfer between said divided pipeline stages adjacent to each other) out of n (=N−1) of said pipeline division sections, not separating all of said N pipeline stages from each other, when the transfer of the a number of data items is started in a cycle corresponding to the a cycle, and activates all of said n pipeline division sections, separating all of said N pipeline stages from each other, when the transfer of the a number of data items is started in a cycle corresponding to an i(mod 2a) cycle different from the a cycle;

a second control section for controlling data transfer from said data transfer path to said register in such a manner that when the transfer of the a number of data items is started in the cycle corresponding to the a cycle, the second control section causes the a number of data items to be transferred to a group of register 0 to register (a−1) and a group of register a to register (2a−1) alternately every the a cycle, and when the transfer of the a number of data items is started in the cycle i(mod 2a) cycle different from the a cycle, the second control section recombines said registers and causes the a number of data items to be transferred to a group of register i(mod 2a) to register (i+a−1(mod 2a)) and a group of register (i+a(mod 2a)) to register (i+2a−1(mod 2a)) alternately every the a cycle; and a third control section for controlling data transfer from said registers in such a manner that it transfers data items serially in synchronization with the clock in the order that said registers have been numbered (provided that control returns to register 0 after register (k−1)).

* * * * *